United States Patent
Lerner et al.

(10) Patent No.: US 7,805,122 B2
(45) Date of Patent: Sep. 28, 2010

(54) LOCAL OSCILLATOR WITH NON-HARMONIC RATIO BETWEEN OSCILLATOR AND RF FREQUENCIES USING DIGITAL MIXING AND WEIGHTING FUNCTIONS

(75) Inventors: Gregory Lerner, Petach Tikva (IL); Nir Tal, Haifa (IL)

(73) Assignee: Texas Instruments Incorporated, Dallas, TX (US)

( * ) Notice: Subject to any disclaimer, the term of this patent is extended or adjusted under 35 U.S.C. 154(b) by 576 days.

(21) Appl. No.: 11/844,439

(22) Filed: Aug. 24, 2007

(65) Prior Publication Data

US 2008/0055009 A1    Mar. 6, 2008

Related U.S. Application Data

(60) Provisional application No. 60/823,837, filed on Aug. 29, 2006.

(51) Int. Cl.
*H04B 7/00* (2006.01)
(52) U.S. Cl. .............. 455/255; 455/76; 455/183.1; 455/260; 455/552.1; 331/57; 331/37; 331/18; 331/25; 331/34; 331/16; 331/40; 331/41; 331/42; 331/43; 331/38; 331/39; 327/156; 327/158; 327/159; 708/270; 708/271; 708/272; 708/273; 708/277; 341/143
(58) Field of Classification Search .......... 455/76, 455/183.1, 260, 552.1, 255; 331/57, 37, 331/18, 1 A, 25, 34, 16, 40, 41, 42, 43, 38, 331/39; 327/156, 158–159; 308/270–277; 341/143
See application file for complete search history.

(56) References Cited

U.S. PATENT DOCUMENTS

| | | | |
|---|---|---|---|
| 6,404,293 B1 * | 6/2002 | Darabi et al. | 331/37 |
| 6,809,598 B1 * | 10/2004 | Staszewski et al. | 331/16 |
| 6,850,749 B2 | 2/2005 | Soorapanth et al. | 455/318 |
| 7,130,603 B2 * | 10/2006 | Futamura et al. | 455/260 |
| 7,502,595 B2 * | 3/2009 | Futamura et al. | 455/76 |
| 2004/0192240 A1 * | 9/2004 | Futamura et al. | 455/183.1 |
| 2006/0033582 A1 * | 2/2006 | Staszewski et al. | 331/16 |
| 2006/0038710 A1 * | 2/2006 | Staszewski et al. | 341/143 |
| 2006/0276142 A1 * | 12/2006 | Futamura et al. | 455/76 |
| 2008/0055008 A1 * | 3/2008 | Staszewski et al. | 331/37 |

* cited by examiner

*Primary Examiner*—Matthew D Anderson
*Assistant Examiner*—April G Gonzales
(74) *Attorney, Agent, or Firm*—Ronald O. Neerings; Wade James Brady, III; Frederick J. Telecky, Jr.

(57) ABSTRACT

A novel and useful apparatus for and method of local oscillator (LO) generation with non-integer multiplication ratio between the local oscillator and RF frequencies. The LO generation schemes presented are operative to generate I and Q square waves at a designated frequency while avoiding the well known issue of harmonic pulling. The signal is input to a synthesizer timed to a rational multiplier of the RF frequency $f_{RF}$. The signal is then divided to generate a plurality of phases of the divided signal. A plurality of combination signals are generated which are then multiplied by a set of weights and summed to cancel out some undersired products. The result is filtered to generate the LO output signal.

26 Claims, 19 Drawing Sheets

LOCAL OSCILLATOR WITH NON-HARMONIC RATIO BETWEEN OSCILLATOR AND RF FREQUENCIES USING DIGITAL MIXING AND WEIGHTING FUNCTIONS

REFERENCE TO PRIORITY APPLICATION

This application claims priority to U.S. Provisional Application Ser. No. 60/823,837, filed Aug. 29, 2006, entitled "Generation of Local-Oscillator Signal with Non-Integer Multiplication Ratio Between the Local-Oscillator and the RF Frequencies", incorporated herein by reference in its entirety.

FIELD OF THE INVENTION

The present invention relates to the field of data communications and more particularly relates to a local oscillator (LO) circuit with non-integer multiplication ratio between the local oscillator and RF frequencies.

BACKGROUND OF THE INVENTION

The use of local oscillator generation circuits for wireless transceivers is well known in the art. The local oscillator is generated as a continuous wave (CW) and is then used for quadrature modulation or demodulation of transmitted and received signals respectively. Alternatively, the oscillator can also perform frequency modulation as part of a polar transmitter architecture system.

A block diagram illustrating an example prior art phase locked look (PLL)-based local oscillator (LO) generator circuit is shown in FIG. 1. The typical PLL LO generation circuit, generally referenced 10, comprises phase detector (PD) 14, loop filter or low pass filter (LPF) 18, controlled oscillator 22, resonator 26 and frequency divider 28.

In operation, a reference signal 12, normally generated by a crystal oscillator, is input to the phase detector 14 along with a divided-down RF frequency continuous wave (CW) 29. The phase detector, typically implemented as a charge pump or mixer, generates a phase error (PE or PHE) 16 proportional to the phase difference between the $f_{REF}$ input signal 12 and RF CW signal 29. The resultant PE signal is then low pass filtered using low pass filter 18 to yield a slow varying frequency command signal 20.

The frequency command signal is input to a controlled oscillator circuit 22, typically a voltage controlled oscillator (VCO) or a digitally controlled oscillator (DCO). This oscillator generates an RF signal 24, the frequency of which roughly depends linearly on the frequency command signal. The oscillator uses a resonator 26 that oscillates in the desired frequency band. Resonator circuits can be inductor-capacitor based (LC) or closed loop inverter chains (ring). The output of the oscillator 22 is the phase locked LO signal $f_{LO}$ or $f_{RF}$ which also undergoes division by N using divider 28 to generate the feedback signal 29 to the phase detector.

A major problem associated with LO generation schemes such as that of FIG. 1 is their susceptibility to RF signal interference. In particular, the resonator used in the circuit (especially inductor based resonators) often picks-up unwanted RF signals and the resonator frequency can be severely perturbed. This phenomenon is known as frequency pulling and is defined as an effect that forces the frequency of an oscillator or resonant frequency to change from a desired value. Causes of the pulling include undesired coupling to another frequency source (e.g., RF intermediate or output signals) or the influence of changes in the oscillator load impedance. Typically, the interferer is either the modulated amplified output RF signal, its harmonics in transmitters or the amplified received signal in receivers. To avoid frequency pulling, a well defined RF transceiver system is built such that the actual resonation frequency of the resonator is neither the output RF frequency, nor any of its harmonics or sub-harmonics.

In the case of a mobile wireless system, for example, transmitters that modulate a non-constant envelope signal require a non-integer ratio between the local oscillator frequency and the RF frequency in order to overcome the pulling effect of the power amplifier's output harmonics. Transmission of a wideband signal in high frequency bands such as 5 GHz, however, requires complicated converters that run at very high frequencies.

A block diagram illustrating an example prior art ½X local oscillator generation scheme is shown in FIG. 2. The example circuit, generally referenced 170, comprises a synthesizer at ½ $f_{RF}$, X2 frequency doubler 176 and polyphase filter 180. In this example LO generation circuit, the input reference frequency $f_{REF}$ 171 is input to synthesizer 172 tuned to exactly ½ the RF frequency ½ $F_{RF}$. The output signal 174 is then input to a frequency doubler 176 to generate a signal at $f_{RF}$. This signal is then filtered via polyphase filter 180 to yield I and Q (i.e. separated by 90 degrees, also referred to as quadrature) output clock signals $f_{LOI}$ 182 and $f_{LOQ}$ 184, respectively, at $f_{RF}$. The polyphase filter is needed in order to generate the quadrature output signals. An advantage of this scheme is the fact that the actual oscillation frequency is not the final output frequency but is half. Although the circuit generates $f_{RF}$ signals, a major disadvantage of using the polyphase filter is that they are typically large and inaccurate filters causing a potentially large IQ mismatch, i.e. LOI and LOQ are not strictly 90 degrees apart. If such a synthesizer solution is inductor based then halving the frequency forces the size of the inductors to increase significantly.

A block diagram illustrating an example prior art 2X local oscillator generation scheme is shown in FIG. 3. The well known and widely used LO generation scheme (2X scheme), generally referenced 190, comprises synthesizer 194 and frequency divider 198. A crystal oscillator generated reference signal 192 is input to a synthesizer 194 tuned exactly to twice the RF frequency (2 $f_{RF}$). The resultant output signal 196 is then divided by two using a frequency divider 198 to generate two signals having a quadrature relationship, i.e. I and Q output signals $f_{LOI}$ 200 and $f_{LOQ}$ 202, respectively, at $f_{RF}$.

These signals can be used to modulate or demodulate a signal using a mixer pair in a zero IF (ZIF) or a near zero IF (NZIF) scheme. The advantages of this scheme is the fact that the actual oscillation frequency is not the final output frequency but its double and that it is relatively easy to generate a clean quadrature pair $f_{LOI}$ and $f_{LOQ}$ using a frequency divider 198.

Two major disadvantages of this scheme, however, are (1) the fact that the second harmonic of the amplified RF signal at 2 $f_{RF}$ can pull the oscillator away, since there could be a small offset between these two frequencies due to data modulation and (2) that the oscillator must be designed to twice the frequency (generally design at high frequencies tends to be more difficult). The first disadvantage can manifest itself in second harmonic leakage from the system output coupling back into the heart of the resonator or the first harmonic coupling back into the synthesizer supply circuitry and generating the second harmonic using a non-linear effect and creating frequency pulling. Another manifestation of this disadvantage can be in the receiver where a high gain version of the input signal at $f_{RF}$, when compressing a certain stage of the reception chain can create a second harmonic, which will also pull the oscillator (i.e. injection pulling or, worse, injection locking). Injection locking occurs when the oscillations of a first system influences a second system to the extent where the second system no longer oscillates at its own natural frequency but rather at the frequency of the first system. In the case of injection pulling, the second system can still oscillate at its own natural frequency, but contains energy at the frequency of the first system. For near-zero IF systems, such injection locking can cause the oscillator to be pulled down or up to the actual RF frequency thus making the system effectively a poorly designed zero-IF system.

To avoid these disadvantages, the LO can be generated at a rational multiplier of the output RF frequency. A block diagram illustrating an example prior art local oscillator generation scheme that generates the LO at a rational multiplier (4/3 $f_{RF}$ in this example) of the output RF frequency is shown in FIG. 4. The prior art LO generation circuit, generally referenced 210, generates the LO at a rational multiplier of the output RF frequency and uses dividers and mixers to generate the output RF frequency. The circuit 210 comprises a synthesizer 214, frequency dividers 216, 220, multipliers 222, 224 and band pass filters (BPF) 226, 228.

The scheme of FIG. 4 is typically known as an offset-LO generator. A crystal oscillator output reference signal 212 is input to a synthesizer (PLL) tuned to exactly 4/3 $f_{RF}$. Its output signal is divided by two using frequency divider 216 to yield a signal at 2/3 $f_{RF}$ 218. This signal is divided by two again using frequency divider 220 to yield a quadrature signal pair 221, 223 at 1/3 $f_{RF}$. Signals 221, 223 are mixed with signal 218 separately via analog mixers 222, 224, respectively. Due to the multiplicative nature of the mixer it generates a product at $f_{RF}$ (its inputs having frequencies of 1/3 $f_{RF}$ and 2/3 $f_{RF}$) while signals 221, 223 also have a 90 degree phase difference at $f_{RF}$ and thus constitute a quadrature pair. Since the mixer is not ideal, however, undesired frequency products at n/3 $f_{RF}$ (where n is an integer, n≠3) will also be present at the output of the mixers. Band pass filters 226, 228 attenuate these unwanted products yielding the final $LO_I$ ($f_{LOI}$) 230, $LO_Q$ ($f_{LOQ}$) 233 signals, respectively.

An advantage of the offset LO scheme 210 is that it is able to generate an LO signal at $f_{RF}$, while the resonator oscillates at a rational multiple of $f_{RF}$ rather than an integer multiple. Hence, no harmonics of the output frequency can interfere with the proper operation of the oscillator. While this circuit generally avoids the frequency pulling phenomena described supra, it has a significant disadvantage in the unwanted products (i.e. spurs) generated by the mixers. These products likely cause spectral emission mask (SEM) violations in the transmitter and can downconvert unwanted jammers or blockers in the receiver. Hence, the spur attenuation or filtering requirement for BPFs 226 and 228 is usually very significant.

It is thus desirable to have a local oscillator generation mechanism that overcomes the disadvantage of the prior art techniques. The local oscillator generation mechanism should preferably be implementable as an all digital circuit and oscillate at a rational RF frequency multiplier (n/m $f_{RF}$) so as to avoid frequency pulling while reducing or alleviating the need for a stringent BPF. Further, the local oscillator generation mechanism should enable wideband modulation, such as for polar modulation, requiring a relatively simple, all digital implementation.

SUMMARY OF THE INVENTION

The present invention is a novel and useful apparatus for and method of local oscillator (LO) generation with non-integer multiplication ratio between the local oscillator and RF frequencies. The LO generation schemes presented herein are operative to generate I and Q square waves at a designated frequency while avoiding the well known issue of harmonic pulling.

The novel LO synthesis schemes described herein are suitable for use in any application requiring the generation of a local oscillator signal having a non-integer multiplication ratio between the local oscillator signal and the output RF frequencies. An example application is provided of a single chip radio, e.g., Bluetooth, GSM, etc., that integrates the RF circuitry with the digital base band (DBB) circuitry on the same die or on close proximity thereto such that frequency pulling would otherwise occur if not for the use of the present invention.

In a first LO generation scheme, the basic PLL structure runs at 4/3 the desired frequency $f_{RF}$. This frequency is divided by two to obtain in-phase and quadrature square waves at 2/3 $f_{RF}$. The in-phase signal is divided by two again to obtain in-phase and quadrature square waves at 1/3 $f_{RF}$. The signals are then logically combined (i.e. combined using digital logic) using XOR operations to obtain I and Q branch signals containing spectral spurs. Since the spurs are located in non-disturbing bands, they can be filtered out.

One of the major advantages of this first scheme is that although a "mixing" occurs at a rate of 1/4 $f_{LO}$, side-bands at a relative distance of 1/4 $f_{LO}$ are avoided. This is achieved without the need for image rejection mixing, thus avoiding another well known problem of timing and amplitude mismatches. Further, most of the operations in the LO generation scheme are implemented digitally utilizing an ADPLL and followed by two divide by two operations and a digital mixer using logical gates.

In a second LO generation scheme, the use of analog mixers of the prior art is avoided and replaced with an XOR gate configured to generate the correct average frequency. The edges are dynamically adjusted by ±T/12 or zero based on the state of the controlled oscillator down-divided clock.

In a third LO generation scheme, the signal is input to a synthesizer timed to a rational multiplier of the RF frequency $f_{RF}$. The signal is then divided to generate a plurality of phases of the divided signal. A plurality of combination signals are generated which are then multiplied by a set of weights and summed to cancel out some undersired products. The result is filtered to generate the LO output signal.

In a fourth LO generation scheme, the signal is input to a synthesizer times to a rational multiplier of the RF frequency L/N $f_{RF}$. The clock signal is then divided by a factor Q to form 2Q phases of the clock at a frequency of L(N*Q) $f_{RF}$. Each phase then undergoes division by L. The phase signals are input to a pulse generator which outputs a plurality of pulses. The pulses are input to a selector which selects which signal to output at any point in time. By controlling the selector, the output clock is generated as a TDM based signal. Any spurs are removed by an optional filter.

In a fifth LO generation scheme, the input baseband signal is interpolated and upconverted in the digital domain to an IF. The LO operates at a frequency which is a n/m division of the target RF frequency $f_{RF}$. The IF frequency is configured to 1/2 of the LO frequency. The upconverted IF signal is then converted to the analog domain via digital power amplifiers followed by voltage combiners. The output of the combiners is band pass filtered to extract the desired replica.

Advantages of the LO generation schemes of the present invention include (1) ensuring that no frequency pulling effects occur since the LO frequency is equal to a non-integer multiple of the RF output frequency; (2) the schemes presented herein are applicable to numerous standards such as PFDM, etc.; and (3) the schemes allow for simpler implementation of a DRP based radio at high frequency bands.

Note that some aspects of the invention described herein may be constructed as software objects that are executed in embedded devices as firmware, software objects that are executed as part of a software application on either an embedded or non-embedded computer system such as a digital signal processor (DSP), microcomputer, minicomputer, microprocessor, etc. running a real-time operating system such as WinCE, Symbian, OSE, Embedded LINUX, etc. or non-real time operating system such as Windows, UNIX, LINUX, etc., or as soft core realized HDL circuits embodied in an Application. Specific Integrated Circuit (ASIC) or Field Programmable Gate Array (FPGA), or as functionally equivalent discrete hardware components.

There is thus provided in accordance with the present invention, an apparatus for generating a local oscillator signal having an output frequency, the method comprising the steps of an oscillator circuit operative to generate a first signal, the first signal having a frequency substantially equal to a rational multiplier N/M of the output frequency, means for dividing the first signal to generate a plurality of second signal phases, a first logical mixing circuit operative to generate M third signals as combinations of the plurality of second signal phases, means for applying a first set of weights to the M third signals to yield M fourth signals and a summer operative to combine the M fourth signals to generate an in-phase output signal having a frequency substantially equal to the output frequency.

There is also provided in accordance with the present invention, a method of generating a local oscillator signal having an output frequency, the method comprising the steps of generating a first signal at a first frequency, the first signal having a frequency substantially equal to a rational multiplier of the output frequency, dividing the first signal to generate a plurality of second signal phases, generating M third signals as combinations of the plurality of second signal phases, applying a first set of weights to the M third signals to yield M fourth signals and summing the M fourth signals to generate an in-phase output signal having a frequency substantially equal to the output frequency.

There is further provided in accordance with the present invention, a radio comprising a transmitter coupled to an antenna, the transmitter comprising a local oscillator having an output frequency, the local oscillator comprising an oscillator circuit operative to generate a first signal at a first frequency, the first signal having a frequency substantially equal to a rational multiplier of the output frequency, means for dividing the first signal to generate a plurality of second signal phases, a first logical mixing circuit operative to generate M third signals as combinations of the plurality of second signal phases, means for applying a first set of weights to the M third signals to yield M fourth signals, a summer operative to combine the M fourth signals to generate an in-phase output signal having a frequency substantially equal to the output frequency, a receiver coupled to the antenna and a baseband processor coupled to the transmitter and the receiver.

BRIEF DESCRIPTION OF THE DRAWINGS

The invention is herein described, by way of example only, with reference to the accompanying drawings, wherein.

DETAILED DESCRIPTION OF THE INVENTION

Notation Used Throughout

Figure 1:
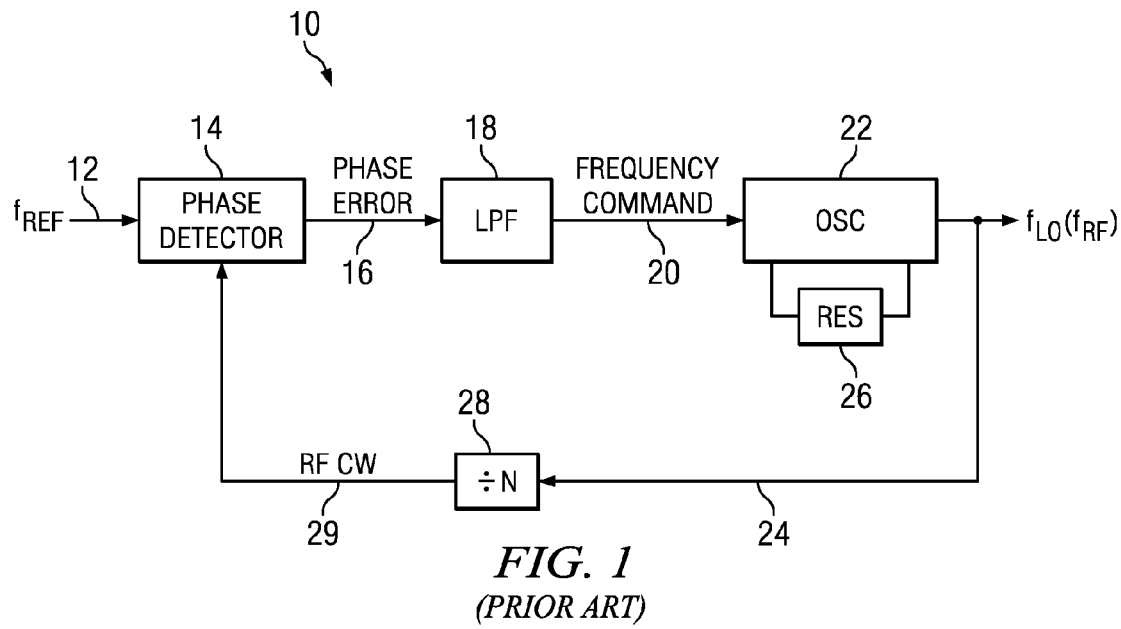
FIG. 1 is a block diagram illustrating an example prior art phase locked look (PLL) local oscillator (LO) generator circuit.
Figure 2:
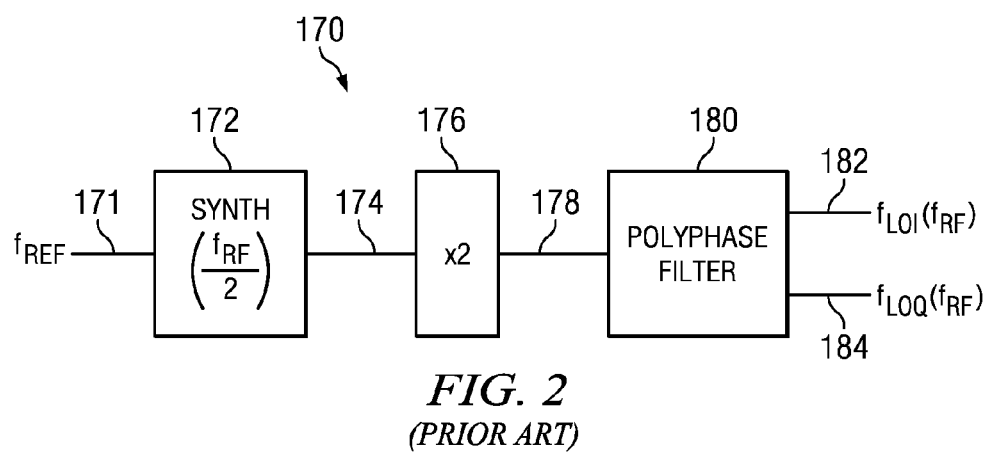
FIG. 2 is a block diagram illustrating an example prior art ½ local oscillator generation scheme.
Figure 3:
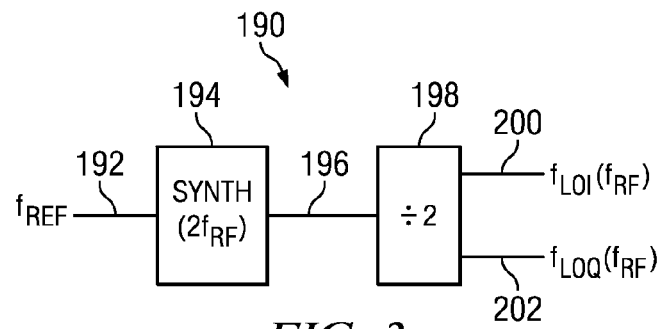
FIG. 3 is a block diagram illustrating an example prior art 2 local oscillator generation scheme.
Figure 4:
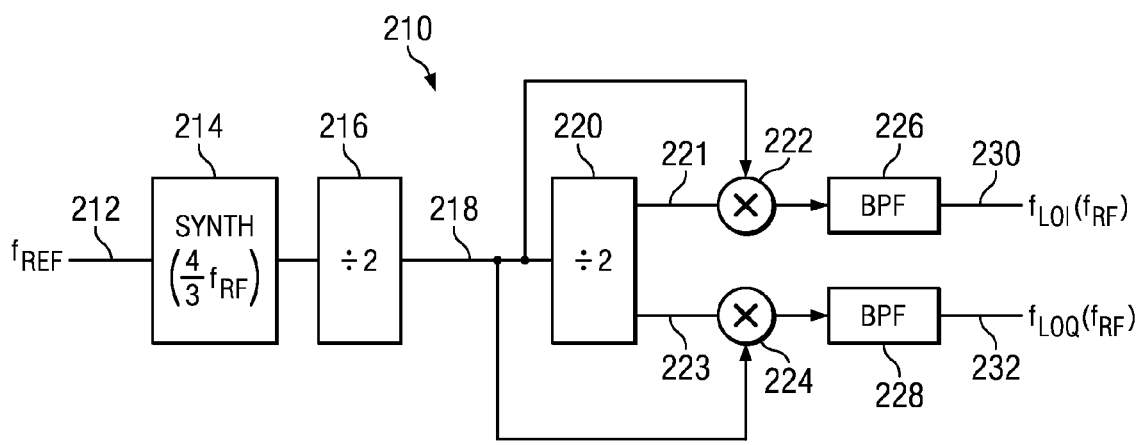
FIG. 4 is a block diagram illustrating an example prior art local oscillator generation scheme that generates the LO at a rational multiplier of the output RF frequency.

The following notation is used throughout this document.

| Term | Definition |
| --- | --- |
| AC | Alternating Current |
| ACL | Asynchronous Connectionless Link |
| ACW | Amplitude Control Word |
| ADC | Analog to Digital Converter |
| ADPLL | All Digital Phase Locked Loop |
| AM | Amplitude Modulation |
| ASIC | Application Specific Integrated Circuit |
| AVI | Audio Video Interface |
| AWS | Advanced Wireless Services |
| BIST | Built-In Self Test |
| BMP | Windows Bitmap |
| BPF | Band Pass Filter |
| CMOS | Complementary Metal Oxide Semiconductor |
| CPU | Central Processing Unit |
| CU | Control Unit |
| CW | Continuous Wave |
| DAC | Digital to Analog Converter |
| dB | Decibel |
| DBB | Digital Baseband |
| DC | Direct Current |
| DCO | Digitally Controlled Oscillator |
| DCXO | Digitally Controlled Crystal Oscillator |
| DPA | Digitally Controlled Power Amplifier |
| DRAC | Digital to RF Amplitude Conversion |
| DRP | Digital RF Processor or Digital Radio Processor |
| DSL | Digital Subscriber Line |
| DSP | Digital Signal Processor |
| EDGE | Enhanced Data Rates for GSM Evolution |
| EDR | Enhanced Data Rate |
| EEPROM | Electrically Erasable Programmable Read Only Memory |
| EPROM | Erasable Programmable Read Only Memory |
| eSCO | Extended Synchronous Connection-Oriented |
| FCC | Federal Communications Commission |
| FCW | Frequency Command Word |
| FIB | Focused Ion Beam |
| FM | Frequency Modulation |
| FPGA | Field Programmable Gate Array |
| GMSK | Gaussian Minimum Shift Keying |
| GPS | Global Positioning System |
| GSM | Global System for Mobile communications |
| HB | High Band |
| HDL | Hardware Description Language |
| HFP | Hands Free Protocol |

-continued

| Term | Definition |
| --- | --- |
| I/F | Interface |
| IC | Integrated Circuit |
| IEEE | Institute of Electrical and Electronics Engineers |
| IIR | Infinite Impulse Response |
| JPG | Joint Photographic Experts Group |
| LAN | Local Area Network |
| LB | Low Band |
| LDO | Low Drop Out |
| LO | Local Oscillator |
| LPF | Low Pass Filter |
| MAC | Media Access Control |
| MAP | Media Access Protocol |
| MBOA | Multiband OFDM Alliance |
| MIM | Metal Insulator Metal |
| Mod | Modulo |
| MOS | Metal Oxide Semiconductor |
| MP3 | MPEG-1 Audio Layer 3 |
| MPG | Moving Picture Experts Group |
| MUX | Multiplexer |
| NZIF | Near Zero IF |
| OFDM | Orthogonal Frequency Division Multiplexing |
| PA | Power Amplifier |
| PAN | Personal Area Network |
| PC | Personal Computer |
| PCI | Personal Computer Interconnect |
| PD | Phase Detector |
| PDA | Personal Digital Assistant |
| PE | Phase Error |
| PHE | Phase Error |
| PLL | Phase Locked Loop |
| PM | Phase Modulation |
| PPA | Pre-Power Amplifier |
| QoS | Quality of Service |
| RAM | Random Access Memory |
| RF | Radio Frequency |
| RFBIST | RF Built-In Self Test |
| RMS | Root Mean Squared |
| ROM | Read Only Memory |
| SAM | Sigma-Delta Amplitude Modulation |
| SAW | Surface Acoustic Wave |
| SCO | Synchronous Connection-Oriented |
| SEM | Spectral Emission Mask |
| SIM | Subscriber Identity Module |
| SoC | System on Chip |
| SRAM | Static Read Only Memory |
| SYNTH | Synthesizer |
| TDC | Time to Digital Converter |
| TDD | Time Division Duplex |
| TV | Television |
| UGS | Unsolicited Grant Services |
| USB | Universal Serial Bus |
| UWB | Ultra Wideband |
| VCO | Voltage Controlled Oscillator |
| WCDMA | Wideband Code Division Multiple Access |
| WiFi | Wireless Fidelity |
| WiMAX | Worldwide Interoperability for Microwave Access |
| WiMedia | Radio platform for UWB |
| WLAN | Wireless Local Area Network |
| WMA | Windows Media Audio |
| WMAN | Wireless Metropolitan Area Network |
| WMV | Windows Media Video |
| WPAN | Wireless Personal Area Network |
| XOR | Exclusive Or |
| ZIF | Zero IF |

DETAILED DESCRIPTION OF THE INVENTION

The present invention is a novel and useful apparatus for and method of local oscillator (LO) generation with non-integer multiplication ratio between the local oscillator and RF output frequencies. The invention is suitable for use in any application requiring the generation of a local oscillator signal having a non-integer multiplication ratio between the local oscillator signal and the output RF frequencies. An example application is provided of a single chip radio that integrates the RF circuitry with the digital base band (DBB) circuitry on the same die or on close proximity thereto such that frequency pulling would otherwise occur if not for the use of the present invention.

Although the LO generation mechanism is applicable to numerous wireless communication standards and can be incorporated in numerous types of wireless or wired communication devices such a multimedia player, mobile station, cellular phone, PDA, DSL modem, WPAN device, etc., it is described in the context of a digital RF processor (DRP) based transmitter that may be adapted to comply with a particular wireless communications standard such as GSM, Bluetooth, EDGE, WCDMA, WLAN, WiMax, etc. It is appreciated, however, that the invention is not limited to use with any particular communication standard and may be used in optical, wired and wireless applications. Further, the invention is not limited to use with a specific modulation scheme but is applicable to any modulation scheme including both digital and analog modulations where there is a need to mitigate the frequency pulling effect of the RF output frequency on the reference frequency clock generation.

Note that throughout this document, the term communications device is defined as any apparatus or mechanism adapted to transmit, receive or transmit and receive data through a medium. The term communications transceiver or communications device is defined as any apparatus or mechanism adapted to transmit and receive data through a medium. The communications device or communications transceiver may be adapted to communicate over any suitable medium, including wireless or wired media. Examples of wireless media include RF, infrared, optical, microwave, UWB, Bluetooth, WiMAX, WiMedia, WiFi, or any other broadband medium, etc. Examples of wired media include twisted pair, coaxial, optical fiber, any wired interface (e.g., USB, Firewire, Ethernet, etc.). The term Ethernet network is defined as a network compatible with any of the IEEE 802.3 Ethernet standards, including but not limited to 10Base-T, 100Base-T or 1000Base-T over shielded or unshielded twisted pair wiring. The terms communications channel, link and cable are used interchangeably. The notation DRP is intended to denote either a Digital RF Processor or Digital Radio Processor. References to a Digital RF Processor infer a reference to a Digital Radio Processor and vice versa.

The term multimedia player or device is defined as any apparatus having a display screen and user input means that is capable of playing audio (e.g., MP3, WMA, etc.), video (AVI, MPG, WMV, etc.) and/or pictures (JPG, BMP, etc.). The user input means is typically formed of one or more manually operated switches, buttons, wheels or other user input means. Examples of multimedia devices include pocket sized personal digital assistants (PDAs), personal media player/recorders, cellular telephones, handheld devices, and the like.

Some portions of the detailed descriptions which follow are presented in terms of procedures, logic blocks, processing, steps, and other symbolic representations of operations on data bits within a computer memory. These descriptions and representations are the means used by those skilled in the data processing arts to most effectively convey the substance of their work to others skilled in the art. A procedure, logic block, process, etc., is generally conceived to be a self-consistent sequence of steps or instructions leading to a desired result. The steps require physical manipulations of physical quantities. Usually, though not necessarily, these quantities take the form of electrical or magnetic signals capable of being stored, transferred, combined, compared and otherwise manipulated in a computer system. It has proven convenient at times, principally for reasons of common usage, to refer to these signals as bits, bytes, words, values, elements, symbols, characters, terms, numbers, or the like.

It should be born in mind that all of the above and similar terms are to be associated with the appropriate physical quantities they represent and are merely convenient labels applied to these quantities. Unless specifically stated otherwise as apparent from the following discussions, it is appreciated that throughout the present invention, discussions utilizing terms such as 'processing,' 'computing,' 'calculating,' 'determining,' 'displaying' or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The invention can take the form of an entirely hardware embodiment, an entirely software embodiment or an embodiment containing a combination of hardware and software elements. In one embodiment, a portion of the mechanism of the invention is implemented in software, which includes but is not limited to firmware, resident software, object code, assembly code, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium is any apparatus that can contain, store, communicate, propagate, or transport the program for use by or in connection with the instruction execution system, apparatus, or device, e.g., floppy disks, removable hard drives, computer files comprising source code or object code, flash semiconductor memory (USB flash drives, etc.), ROM, EPROM, or other semiconductor memory devices.

Single Chip Radio

Figure 5:
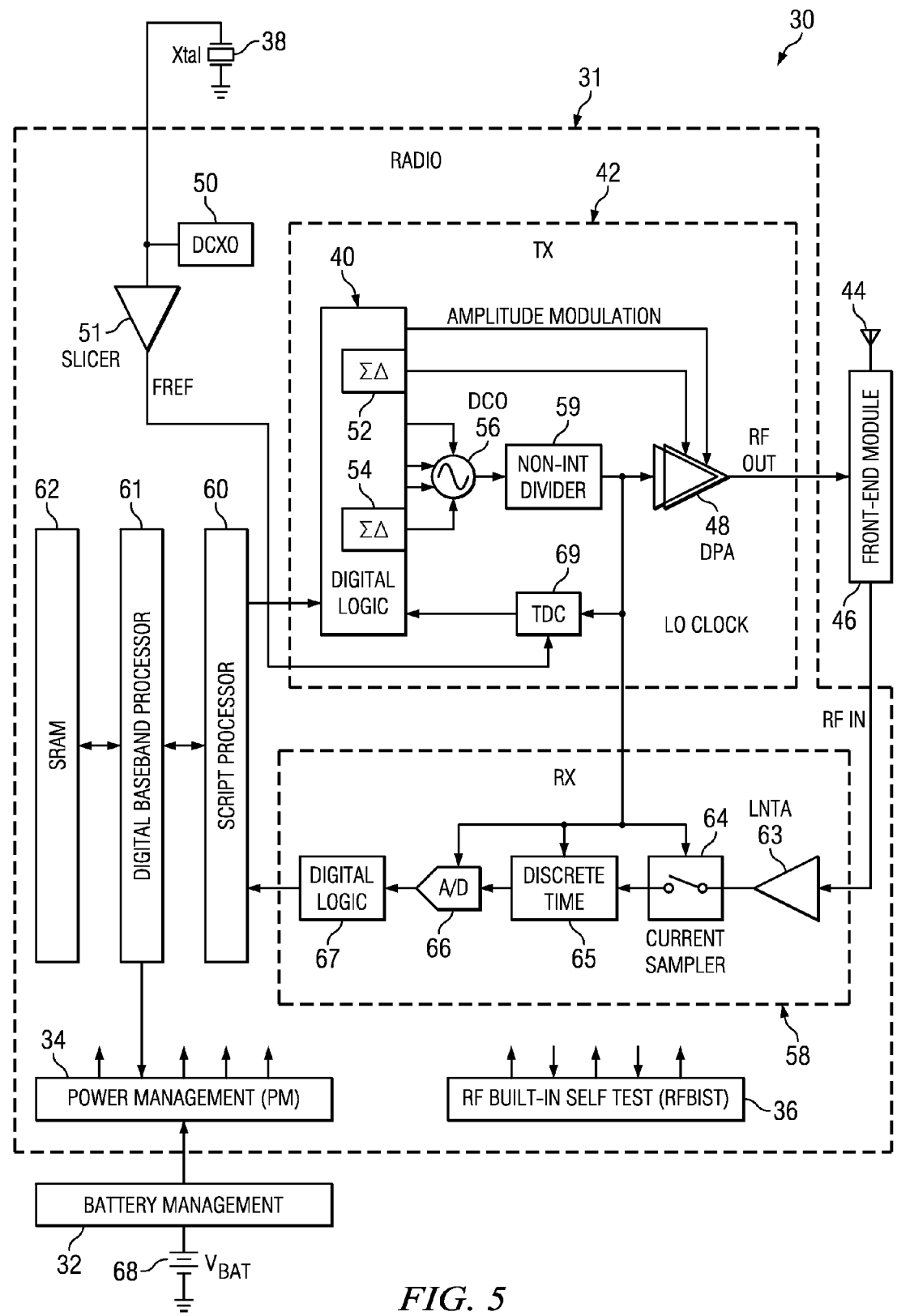
FIG. 5 is a block diagram illustrating a single chip polar transceiver radio incorporating an all-digital local oscillator based transmitter and receiver and local oscillator (LO) generation mechanism of the present invention.

A block diagram illustrating a single chip polar transceiver radio incorporating an all-digital local oscillator based transmitter and receiver and local oscillator (LO) generation mechanism of the present invention is shown in FIG. 5. For illustration purposes only, the transmitter, as shown, is adapted for the GSM/EDGE/WCDMA cellular standards. It is appreciated, however, that one skilled in the communication arts can adapt the transmitter illustrated herein to other modulations and communication standards as well without departing from the spirit and scope of the present invention.

The radio, generally referenced 30, comprises a radio integrated circuit 31 coupled to a crystal 38, front end module 46 coupled to an antenna 44, and battery management circuit 32 coupled to battery 68. The radio chip 31 comprises a script processor 60, digital baseband (DBB) processor 61, memory 62 (e.g., static RAM), TX block 42, RX block 58, digitally controlled crystal oscillator (DCXO) 50, slicer 51, power management unit 34 and RF built-in self test (BIST) 36. The TX block comprises high speed and low speed digital logic block 40 including $\Sigma\Delta$ modulators 52, 54, digitally controlled oscillator (DCO) 56, non-integer divider block 59 and digitally controlled power amplifier (DPA) 48. The RX block comprises a low noise transconductance amplifier 63, current sampler 64, discrete time processing block 65, analog to digital converter (ADC) 66 and digital logic block 67.

The principles presented herein have been used to develop three generations of a Digital RF Processor (DRP): single-chip Bluetooth, GSM and GSM/EDGE radios realized in 130 nm, 90 nm and 65 nm digital CMOS process technologies, respectively. This architecture is also used as the foundation for a UMTS single-chip radio manufactured using a 45 nm CMOS process. The common architecture is highlighted in FIG. 5 with features added specific to the cellular radio. The all digital phase locked loop (ADPLL) based transmitter employs a polar architecture with all digital phase/frequency and amplitude modulation paths. The receiver employs a discrete-time architecture in which the RF signal is directly sampled and processed using analog and digital signal processing techniques.

A key component is the digitally controlled oscillator (DCO) 56, which avoids any analog tuning controls. A digitally-controlled crystal oscillator (DCXO) generates a high-quality base station-synchronized frequency reference such that the transmitted carrier frequencies and the received symbol rates are accurate to within 0.1 ppm. Fine frequency resolution is achieved through high-speed $\Sigma\Delta$ dithering of its varactors. Digital logic built around the DCO realizes an all-digital PLL (ADPLL) that is used as a local oscillator for both the transmitter and receiver. In accordance with the invention, the output of the DCO undergoes non-integer open-loop division using non-integer divider block 59. The polar transmitter architecture utilizes the wideband direct frequency modulation capability of the ADPLL and a digitally controlled power amplifier (DPA) 48 for the amplitude modulation. The DPA operates in near-class-E mode and uses an array of nMOS transistor switches to regulate the RF amplitude. It is followed by a matching network and an external front-end module 46, which comprises a power amplifier (PA), a transmit/receive switch for the common antenna 44 and RX surface acoustic wave (SAW) filters. Fine amplitude resolution is achieved through high-speed $\Sigma\Delta$ dithering of the DPA nMOS transistors.

The receiver 58 employs a discrete-time architecture in which the RF signal is directly sampled at the Nyquist rate of the RF carrier and processed using analog and digital signal processing techniques. The transceiver is integrated with a script processor 60, dedicated digital base band processor 61 (i.e. ARM family processor and/or DSP) and SRAM memory 62. The script processor handles various TX and RX calibration, compensation, sequencing and lower-rate data path tasks and encapsulates the transceiver complexity in order to present a much simpler software programming model.

The frequency reference (FREF) is generated on-chip by a 26 MHz (or any other desired frequency, such as 13 or 38.4 MHz) digitally controlled crystal oscillator (DCXO) 50 coupled to slicer 51. The output of the slicer is input to the TDC circuit 69.

An integrated power management (PM) system 34 is connected to an external battery management circuit 32 that conditions and stabilizes the supply voltage. The PM comprises multiple low drop out (LDO) regulators that provide internal supply voltages and also isolate supply noise between circuits, especially protecting the DCO. The RF built-in self-test (RFBIST) 36 performs autonomous phase noise and modulation distortion testing, various loopback configurations for bit-error rate measurements and implements the DPA calibration and BIST mechanism. The transceiver is integrated with the digital baseband, SRAM memory in a complete system-on-chip (SoC) solution. Almost all the clocks on this SoC are derived from and are synchronous to the RF oscillator clock. This helps to reduce susceptibility to the noise generated through clocking of the massive digital logic.

The transmitter comprises a polar architecture in which the amplitude and phase/frequency modulations are implemented in separate paths. Transmitted symbols generated in the digital baseband (DBB) processor are first pulse-shape filtered in the Cartesian coordinate system. The filtered in-phase (I) and quadrature (Q) samples are then converted through a CORDIC algorithm into amplitude and phase samples of the polar coordinate system. The phase is then differentiated to obtain frequency deviation. The polar signals are subsequently conditioned through signal processing to sufficiently increase the sampling rate in order to reduce the quantization noise density and lessen the effects of the modulating spectrum replicas.

A more detailed description of the operation of the ADPLL can be found in U.S. Patent Publication No. 2006/0033582A1, published Feb. 16, 2006, to Staszewski et al., entitled "Gain Calibration of a Digital Controlled Oscillator," U.S. Patent Publication No. 2006/0038710A1, published Feb. 23, 2006, Staszewski et al., entitled "Hybrid Polar/Cartesian Digital Modulator" and U.S. Pat. No. 6,809,598, to Staszewski et al., entitled "Hybrid Of Predictive And Closed-Loop Phase-Domain Digital PLL Architecture," all of which are incorporated herein by reference in their entirety.

Mobile Device/Cellular Phone/PDA System

Figure 6:
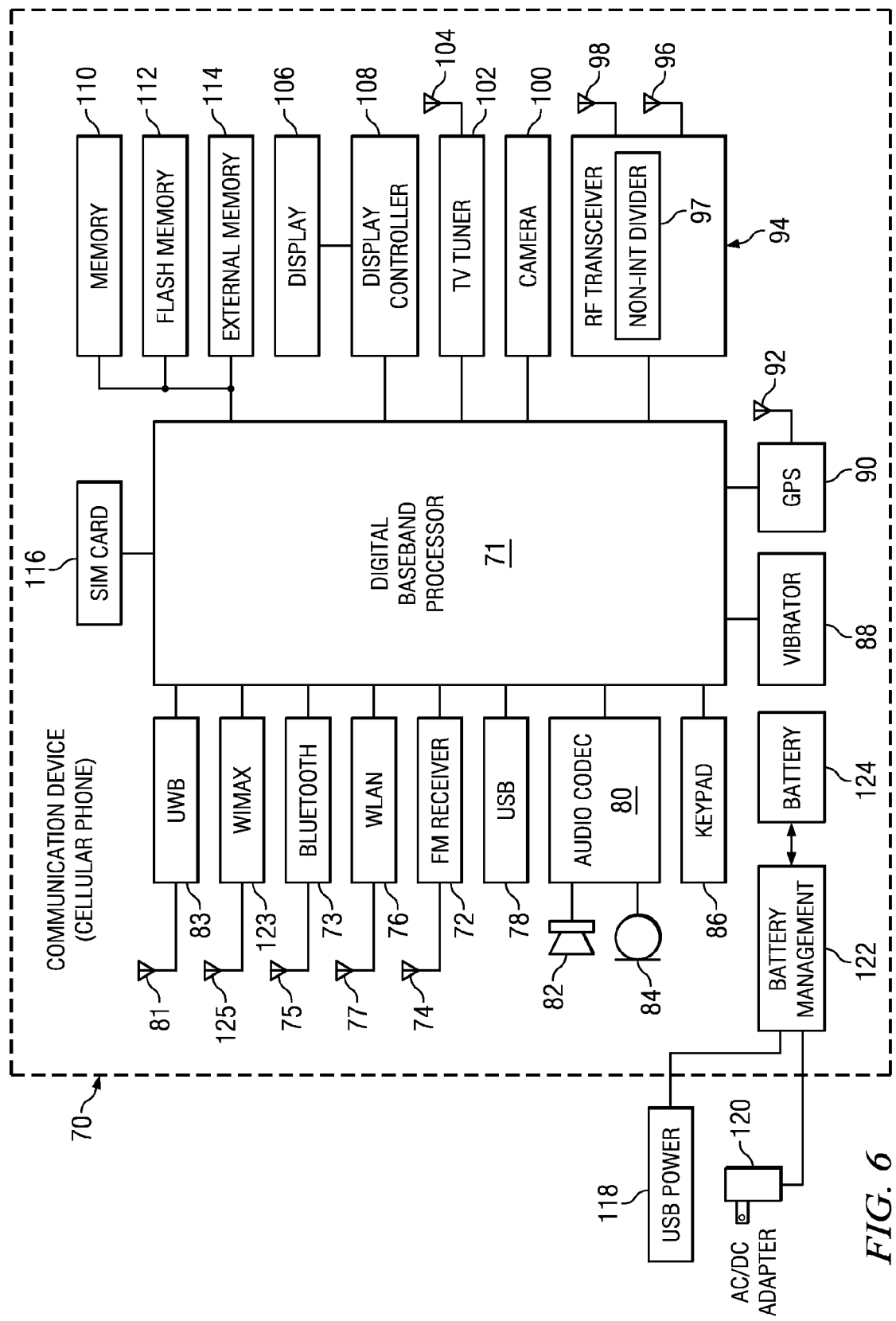
FIG. 6 is a simplified block diagram illustrating an example mobile communication device incorporating the local oscillator generation mechanism of the present invention.

A simplified block diagram illustrating an example mobile communication device incorporating the local oscillator generation mechanism of the present invention is shown in FIG. 6. The communication device may comprise any suitable wired or wireless device such as a multimedia player, mobile station, mobile device, cellular phone, PDA, wireless personal area network (WPAN) device, Bluetooth EDR device, etc. For illustration purposes only, the communication device is shown as a cellular phone or smart phone. Note that this example is not intended to limit the scope of the invention as the LO generation mechanism of the present invention can be implemented in a wide variety of wireless and wired communication devices.

The cellular phone, generally referenced 70, comprises a baseband processor or CPU 71 having analog and digital portions. The basic cellular link is provided by the RF transceiver 94 and related one or more antennas 96, 98. A plurality of antennas is used to provide antenna diversity which yields improved radio performance. The cell phone also comprises internal RAM and ROM memory 110, Flash memory 112 and external memory 114.

In accordance with the invention, the RF transceiver comprises a non-integer LO divider block 97 that generates an RF frequency $f_{RF}$ where the RF output frequency is a non-integer multiple of the LO circuit frequency, as described in more detail infra. In operation, the LO generation mechanism may be implemented as hardware, as software executed as a task on the baseband processor 71 or a combination of hardware and software. Implemented as a software task, the program code operative to implement the frequency generation mechanism of the present invention is stored in one or more memories 110, 112 or 114.

Several user interface devices include microphone 84, speaker 82 and associated audio codec 80, a keypad for entering dialing digits 86, vibrator 88 for alerting a user, camera and related circuitry 100, a TV tuner 102 and associated antenna 104, display 106 and associated display controller 108 and GPS receiver 90 and associated antenna 92.

A USB interface connection 78 provides a serial link to a user's PC or other device. An FM receiver 72 and antenna 74 provide the user the ability to listen to FM broadcasts. WLAN radio and interface 76 and antenna 77 provide wireless connectivity when in a hot spot or within the range of an ad hoc, infrastructure or mesh based wireless LAN network. A Bluetooth EDR radio and interface 73 and antenna 75 provide Bluetooth wireless connectivity when within the range of a Bluetooth wireless network. Further, the communication device 70 may also comprise a WiMAX radio and interface 123 and antenna 125. SIM card 116 provides the interface to a user's SIM card for storing user data such as address book entries, etc. The communication device 70 also comprises an Ultra Wideband (UWB) radio and interface 83 and antenna 81. The UWB radio typically comprises an MBOA-UWB based radio.

Portable power is provided by the battery 124 coupled to battery management circuitry 122. External power is provided via USB power 118 or an AC/DC adapter 120 connected to the battery management circuitry which is operative to manage the charging and discharging of the battery 124.

ADPLL Polar Transmitter Incorporating LO Generation Mechanism

Figure 7:
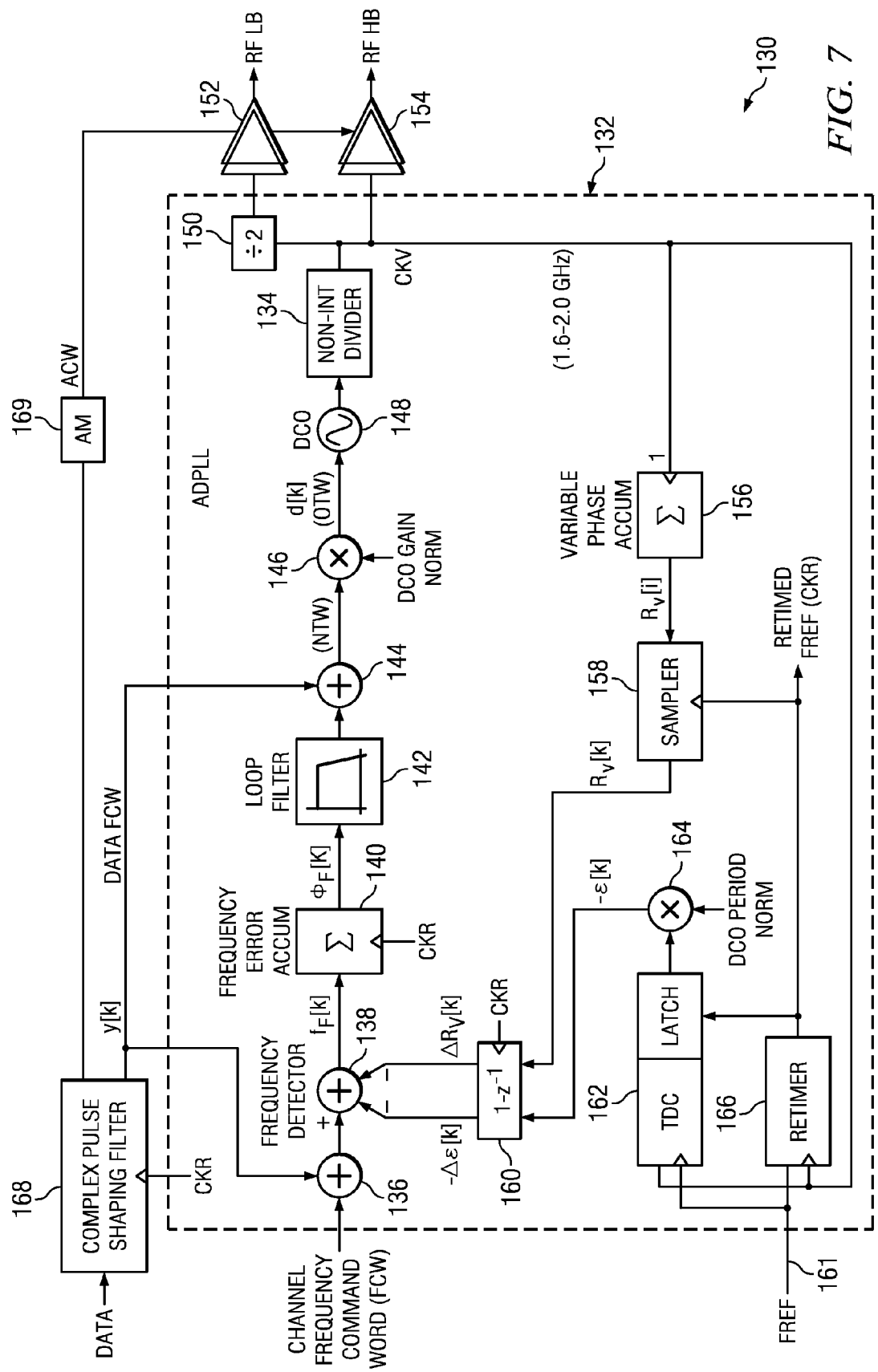
FIG. 7 is a block diagram illustrating an example all digital phase locked loop (ADPLL) incorporating the local oscillator generation mechanism of the present invention.

A block diagram illustrating an ADPLL-based polar transmitter for wireless applications incorporating the LO generation mechanism of the present invention is shown in FIG. 7. A more detailed description of the operation of the ADPLL can be found in U.S. Patent Publication No. 2006/0033582A1, published Feb. 16, 2006, to Staszewski et al., entitled "Gain Calibration of a Digital Controlled Oscillator," U.S. Patent Publication No. 2006/0038710A1, published Feb. 23, 2006, Staszewski et al., entitled "Hybrid Polar/Cartesian Digital Modulator" and U.S. Pat. No. 6,809,598, to Staszewski et al., entitled "Hybrid Of Predictive And Closed-Loop Phase-Domain Digital PLL Architecture," all of which are incorporated herein by reference in their entirety.

For illustration purposes only, the transmitter, as shown, is adapted for the GSM/EDGE/WCDMA cellular standards. It is appreciated, however, that one skilled in the communication arts can adapt the transmitter illustrated herein to other modulations and communication standards as well without departing from the spirit and scope of the present invention.

The transmitter, generally referenced 130, is well-suited for a deep-submicron CMOS implementation. The transmitter comprises a complex pulse shaping filter 168, amplitude modulation (AM) block 169 and ADPLL 132. The circuit 130 is operative to perform complex modulation in the polar domain in addition to the generation of the local oscillator (LO) signal for the receiver. All clocks in the system are derived directly from this source. Note that the transmitter is constructed using digital techniques that exploit the high speed and high density of the advanced CMOS, while avoiding problems related to voltage headroom. The ADPLL circuit replaces a conventional RF synthesizer architecture (based on a voltage-controlled oscillator (VCO) and a phase/frequency detector and charge-pump combination), with a digitally controlled oscillator (DCO) 148, a time-to-digital converter (TDC) 162 and a non-integer LO divider 134. All inputs and outputs are digital and some even at multi-GHz frequency.

The core of the ADPLL is a digitally controlled oscillator (DCO) 148 adapted to generate the RF oscillator clock CKV. The oscillator core (not shown) operates at a rational multiplier of the 1.6-2.0 GHz (e.g., 4/3) high band frequency or at a rational multiplier of the 0.8-1.0 GHz low band frequency (e.g., 4/3). The output of the DCO is then divided using a non-integer LO divider 134 in accordance with the present invention for precise generation of RX quadrature signals, and for use as the transmitter's carrier frequency. The single DCO is shared between transmitter and receiver and is used for both the high frequency bands (HB) and the low frequency bands (LB). In addition to the integer control of the DCO, at least 3-bits of the minimal varactor size used are dedicated for ΣΔ dithering in order to improve frequency resolution. The DCO comprises a plurality of varactor banks, which may be realized as n-poly/n-well inversion type MOS capacitor (MOSCAP) devices or Metal Insulator Metal (MIM) devices that operate in the flat regions of their C-V curves to assist digital control. The output of the DCO is input to the non-integer LO divider 134, which generates a modulated digital signal at $f_{RF}$. This signal is input to the pre-power amplifier (PPA) 152. It is also input to the RF low band pre-power amplifier 154 after divide by two via divider 150. Note that alternatively, the loop may be closed by coupling the signal output of the DCO before the non-integer LO divider to the retimer and TDC circuits.

The expected variable frequency $f_V$ is related to the reference frequency $f_R$ by the frequency command word (FCW).

$$FCW[k] \equiv \frac{E(f_V[k])}{f_R} \qquad (1)$$

The FCW is time variant and is allowed to change with every cycle $T_R = 1/f_R$ of the frequency reference clock. With $W_F = 24$ the word length of the fractional part of FCW, the ADPLL provides fine frequency control with 1.5 Hz accuracy, according to:

$$\Delta f_{res} = \frac{f_R}{2^{W_F}} \qquad (2)$$

The number of integer bits $W_I = 8$ has been chosen to fully cover the GSM/EDGE and partial WCDMA band frequency range of $f_V = 1,600$-$2,000$ MHz with an arbitrary reference frequency $f_R \geq 8$ MHz.

The ADPLL operates in a digitally-synchronous fixed-point phase domain as follows: The variable phase accumulator 156 determines the variable phase $R_V[i]$ by counting the number of rising clock transitions of the DCO oscillator clock CKV as expressed below.

$$R_V[i] = \sum_{l=0}^{i} 1 \qquad (3)$$

The index i indicates the DCO edge activity. The variable phase $R_V[i]$ is sampled via sampler 158 to yield sampled FREF variable phase $R_V[k]$, where k is the index of the FREF edge activity. The sampled FREF variable phase $R_V[k]$ is fixed-point concatenated with the normalized time-to-digital converter (TDC) 162 output $\epsilon[k]$. The TDC measures and quantizes the time differences between the frequency reference FREF and the DCO clock edges. The sampled differentiated (via block 160) variable phase is subtracted from the frequency command word (FCW) by the digital frequency detector 138. The frequency error $f_E[k]$ samples $$f_E[k] = FCW - [(R_V[k] - \epsilon[k]) - (R_V[k-1] - \epsilon[k-1])] \qquad (4)$$

are accumulated via the frequency error accumulator 140 to create the phase error $\phi_E[k]$ samples $$\phi_E[k] = \sum_{l=0}^{k} f_E[l] \qquad (5)$$

which are then filtered by a fourth order IIR loop filter 142 and scaled by a proportional loop attenuator α. A parallel feed with coefficient ρ adds an integrated term to create type-II loop characteristics which suppress the DCO flicker noise.

The IIR filter is a cascade of four single stage filters, each satisfying the following equation:

$$y[k]=(1-\lambda)\cdot y[k-1]+\lambda\cdot x[k] \quad (6)$$

wherein x[k] is the current input;

y[k] is the current output;

k is the time index;

λ is the configurable coefficient;

The 4-pole IIR loop filter attenuates the reference and TDC quantization noise with an 80 dB/dec slope, primarily to meet the GSM/EDGE spectral mask requirements at 400 kHz offset. The filtered and scaled phase error samples are then multiplied by the DCO gain $K_{DCO}$ normalization factor $f_R/\hat{K}_{DCO}$ via multiplier 146, where $f_R$ is the reference frequency and $\hat{K}_{DCO}$ is the DCO gain estimate, to make the loop characteristics and modulation independent from $K_{DCO}$. The modulating data is injected into two points of the ADPLL for direct frequency modulation, via adders 136 and 144. A hitless gear-shifting mechanism for the dynamic loop bandwidth control serves to reduce the settling time. It changes the loop attenuator α several times during the frequency locking while adding the $(\alpha_1/\alpha_2-1)\phi_1$ dc offset to the phase error, where indices 1 and 2 denote before and after the event, respectively. Note that $\phi_1=\phi_2$, since the phase is to be continuous.

The frequency reference FREF is input to the retimer 166 and provides the clock for the TDC 162. The FREF input is resampled by the RF oscillator clock CKV via retimer block 166 which may comprise a flip flop or register clocked by the reference frequency FREF. The resulting retimed clock (CKR) is distributed and used throughout the system. This ensures that the massive digital logic is clocked after the quiet interval of the phase error detection by the TDC. Note that in the example embodiment described herein, the ADPLL is a discrete-time sampled system implemented with all digital components connected with all digital signals.

First Embodiment: Non-Harmonic DCO With XOR and BPF (Offset LO Generator)

In a first LO generation scheme, the basic PLL structure runs at ⅔ the desired frequency $f_{RF}$. This frequency is divided by two to obtain in-phase and quadrature square waves at ⅔ $f_{RF}$. It is noted that the division by two would not be necessary if the quadrature generation of the square wave clocks is achieved through some other means. In this case, the oscillator could operate at a lower frequency. The in-phase signal is divided by two again to obtain in-phase and quadrature square waves at ⅓ $f_{RF}$. The signals are then logically mixed using XOR operations to obtain I and Q branch signals containing spectral spurs every $((2n+1)/3)f_{RF}$, where n is an integer. Since the spurs are located in non-disturbing bands, they can be filtered out. In a deep-submicron chip, for example, there is a need for a digital implementation of the above described LO generation scheme.

Figure 8:
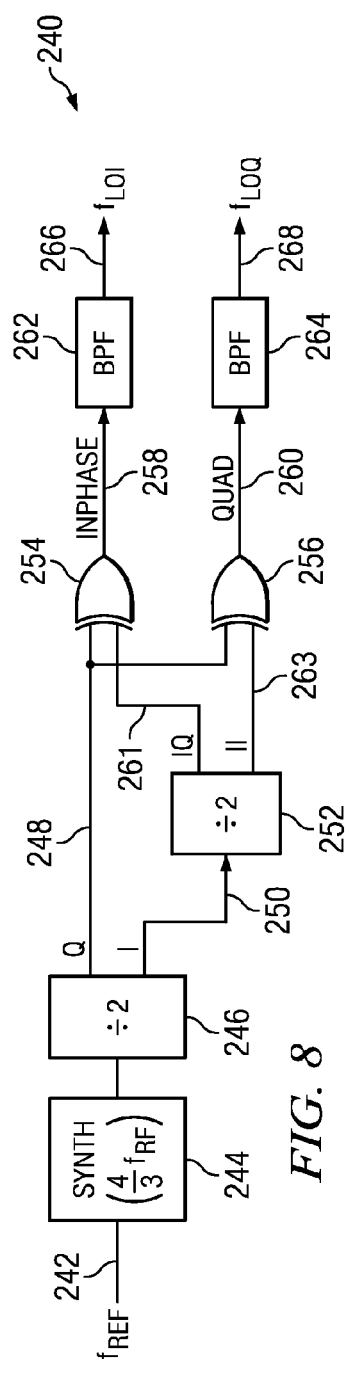
FIG. 8 is a block diagram illustrating a first embodiment of the local oscillator generation mechanism of the present invention employing an offset LO generator.

A block diagram illustrating a first embodiment of the local oscillator generation mechanism of the present invention employing an offset LO generator is shown in FIG. 8. The circuit, generally referenced 240, is a fully digital implementation of an offset LO generator. The circuit 240 comprises a synthesizer 244, frequency dividers 246, 252, XOR gates 254, 256 and band pass filters 262, 264.

In operation, a reference signal $f_{REF}$ 242 generated by a crystal oscillator is input to a synthesizer 244 tuned to exactly ⅔$f_{RF}$. The output of the synthesizer is divided by two via divider 246 to generate a quadrature pair clocks (quadrature 248 and in-phase 250) at ⅔ $f_{RF}$. The in-phase signal 250 is further divided via divider 252 into another quadrature pair (quadrature 261 and in-phase 263) at ⅓ $f_{RF}$. The quadrature signal 248 is XORed with the quadrature divided signal 261 via XOR circuit 254 to generate an in-phase unfiltered LO signal 258 having spectral spurs every $f_{RF}/2$. The in-phase signal 263 is mixed with the quadrature divided signal 248 via XOR circuit 256 to yield the unfiltered LO quadrature signal 260. Quadrature pair 258, 260 undergo band pass filtering via filters 262, 264 to yield the output local oscillator signals $LO_I$ ($f_{LOI}$) 266, $LO_Q$ ($f_{LOQ}$) 268, respectively.

Figure 9:
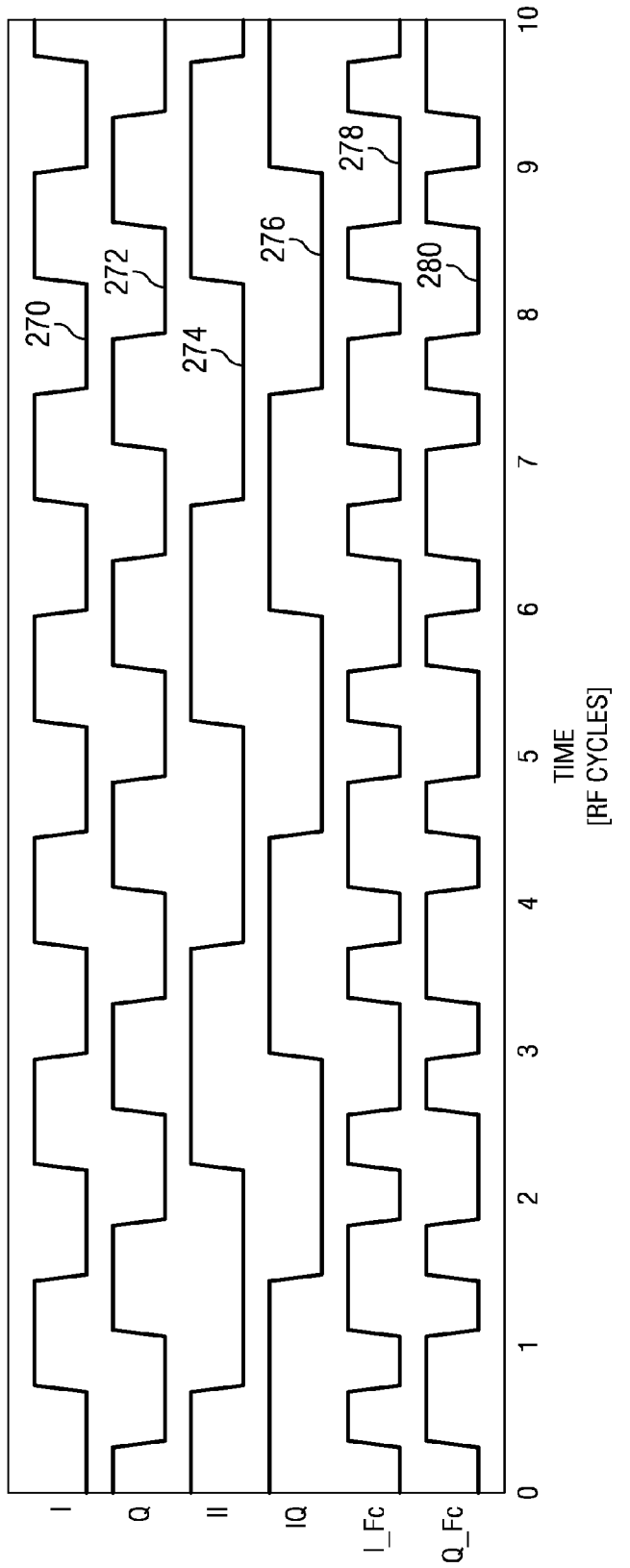
FIG. 9 is a timing diagram illustrating the various digital traces for the first embodiment local oscillator generation mechanism of the present invention shown in FIG. 8.

A timing diagram illustrating the various digital traces for the first embodiment local oscillator generation mechanism of the present invention of FIG. 8 is shown in FIG. 9. Signal I (trace 270) shows the first divider 246 in-phase signal 250, while signal Q (trace 272) shows the first divider 246 quadrature signal 248. These signals have a 90 degree phase shift relationship to each other. Signal II (trace 274) shows the in-phase signal 263 output of the second divider 252, while signal IQ (trace 276) shows the second divider 252 quadrature output 261. Signals I_$F_c$ (trace 278) and Q_$F_c$ (trace 280) show the time behavior of the in-phase and quadrature unfiltered LO signals 258 and 260, respectively. From the timing diagram, it is evident that these signals are not spectrally pure sine waves but have a binary pattern of 10110100, sampled at ⅜ T, where T=1/$f_{RF}$.

Figure 10:
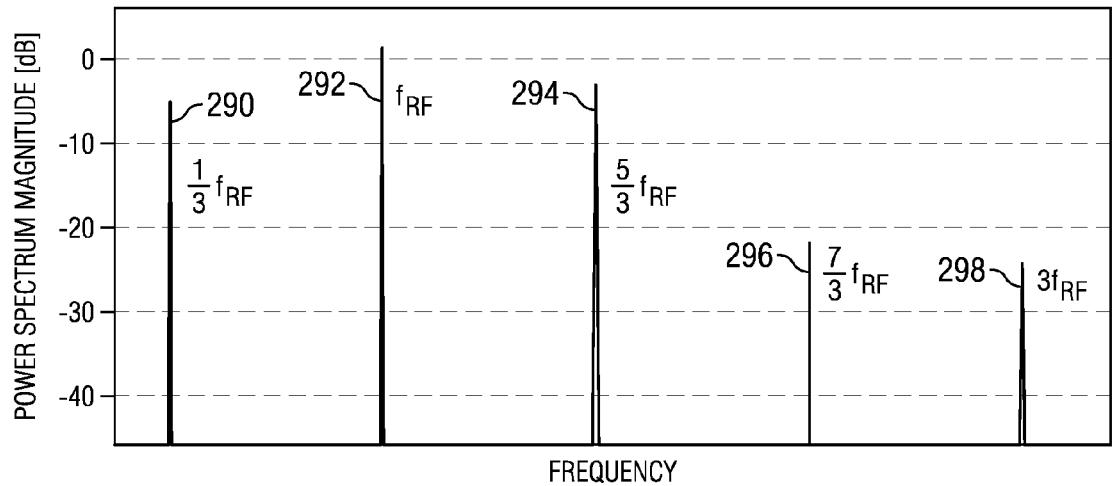
FIG. 10 is a graph illustrating the spectrum magnitude plot of the output of the circuit of FIG. 8.

A graph illustrating the spectrum magnitude plot of the output of the circuit of FIG. 8 is shown in FIG. 10. In particular, the spectrum shows a power spectrum magnitude plot of signal traces 278 or 280. The plot comprises the fundamental or desired frequency product at $f_{RF}$ (peak 292) as well as undesired products at $((1+2n)/3) f_{RF}$, where n is an integer (i.e. peaks 290, 294, 296, 298). The magnitude of the undesired harmonic 290 at ⅓ $f_{RF}$ is approximately −7 dB, while its counterpart at ⅗ $f_{RF}$ is about −5 dB. The magnitude of the unwanted peaks, creates the need for stringent requirements on BPFs 262, 264.

The basic ADPLL structure (FIG. 7) runs at approximately 3.2 GHz (⅔ times the desired frequency $f_{LO}$). As described supra, the LO frequency is divided by two to obtain in phase and quadrature square waves at ⅔ $f_{LO}$ and subsequently divided down again to obtain in-phase and quadrature square waves at ⅓ $f_{LO}$. A logical type "mixing" operation is then applied using the following equations:

$$I=NXOR(Q,IQ)$$

$$Q=NXOR(II,Q) \quad (7)$$

where nxor(A,B)=AB or $\overline{AB}$;

$\overline{A}$ being the logical NOT of A;

Note that the logical combining operation may comprise either NXOR or XOR yielding either the signal or its inverse polarity (i.e. 180 degree) signal. In electrical terms, this means that all the operations from the ADPLL up to the band pass filters are carried out by high speed analog circuits, while the band pass filters are analog in nature followed by a slicer (inverting or non-inverting).

A mathematical derivation for the first embodiment will now be presented. In the case of no mismatch, writing the Fourier series for the I signal, we obtain:

$$I_1 = \frac{2j}{\pi} \sum_{\substack{n=-\infty \\ n\,odd}}^{\infty} \frac{1}{n} e^{j2\pi n f t} \tag{8}$$

where f denotes the square wave frequency after the first divider;
t denotes time;
j denotes $\sqrt{-1}$;
Similar results can be obtained for Q, II and IQ.

$$Q = \frac{2j}{\pi} \sum_{\substack{n=-\infty \\ n\,odd}}^{\infty} \frac{1}{n} e^{j2\pi n \left(ft-\frac{1}{4}\right)} \tag{9}$$

$$II = \frac{2j}{\pi} \sum_{\substack{n=-\infty \\ n\,odd}}^{\infty} \frac{1}{n} e^{j2\pi n \frac{f}{2} t} \tag{10}$$

$$IQ = \frac{2j}{\pi} \sum_{\substack{n=-\infty \\ n\,odd}}^{\infty} \frac{1}{n} e^{j2\pi n \left(\frac{f}{2} t - \frac{1}{4}\right)} \tag{11}$$

The NXOR operation is equivalent to time domain multiplication and therefore the $LO_I$ and $LO_Q$ signals can be expressed as:

$$LO_I = Q \cdot IQ = \frac{-4}{\pi^2} \sum_{\substack{n,m=-\infty \\ n,m\,odd}}^{\infty} \frac{1}{nm} e^{j2\pi \left(\left(n+\frac{m}{2}\right)ft - \frac{1}{4}(n+m)\right)} \tag{12}$$

$$LO_Q = II \cdot Q = \frac{-4}{\pi^2} \sum_{\substack{n,m=-\infty \\ n,m\,odd}}^{\infty} \frac{1}{nm} e^{j2\pi \left(\left(\frac{n}{2}+m\right)ft - \frac{1}{4}m\right)} \tag{13}$$

For each frequency product of interest (F), the appropriate m, n pairs can be found which satisfy the correct frequency conditions in Equations 12 and 13. Note, however, that the frequency products yielding F=kf (for integer 'k's) are not generated.

Second Embodiment: Non-Harmonic DCO with XOR and Jitter Compensation #1

Figure 11:
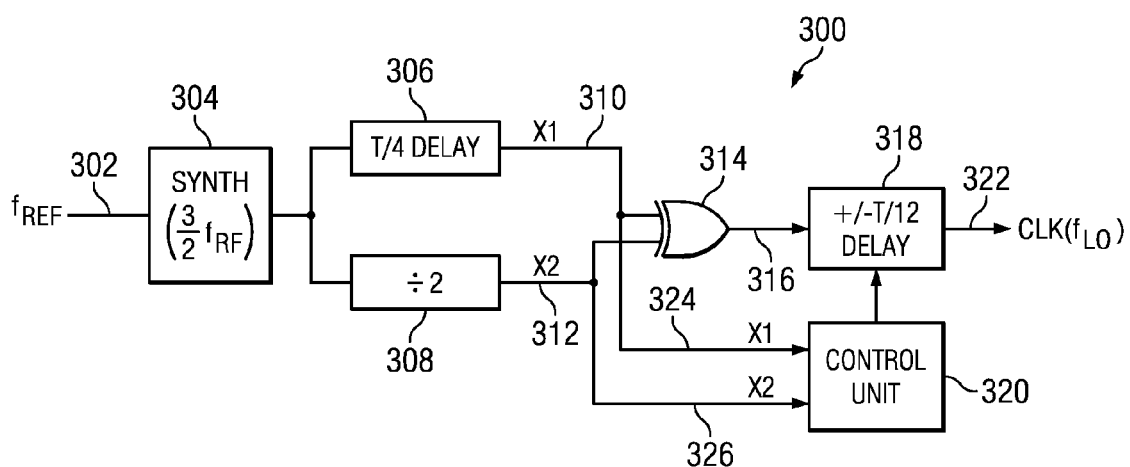
FIG. 11 is a block diagram illustrating a second embodiment of the local oscillator generation mechanism of the present invention.

A block diagram illustrating a second embodiment of the local oscillator generation mechanism of the present invention is shown in FIG. 11. The circuit, generally referenced 300, comprises a synthesizer 304, T/4 delay 306, frequency divider 308, XOR gate 314, ±T/12 delay 318 and control unit 320.

In operation, a reference signal $f_{REF}$ 302 is input to a synthesizer tuned to exactly ⅔ $f_{RF}$. Alternatively, the ⅘ $f_{RF}$ configuration with a quadrature divider generating 90-degree spaced clocks could be used. In this case, the T/4 delay would not be needed. The digital output of the synthesizer is input to a T/4 delay 306 and a divide by two circuit 308. The outputs of both blocks are XORed together via XOR circuit 314. The output of the XOR circuit is input to a programmable ±T/12 delay 318. Since the absolute delay of block 318 does not change the overall structure, a "negative delay" can be achieved using two paths whose relative delay difference is 2*T/12=T/6.

The ±T/12 delay block is controlled by control unit (CU) 320 which selects the delay that should be taken based on the X1 324 and X2 326 input ports. The control unit logic may be implemented in any suitable manner to yield the desired waveform. For example, the control unit may comprise a state machine appropriately programmed (known to one skilled in the art) such that on rising edges of X1 the delay is set to +T/12, while on falling edges, the delay is set to −T/12. Thus, the control unit determines which way the output LO clock 322 is pulled. Rising edges of X1, the output LO clock is pulled forward, while falling edges pull the output LO clock back.

Figure 12:
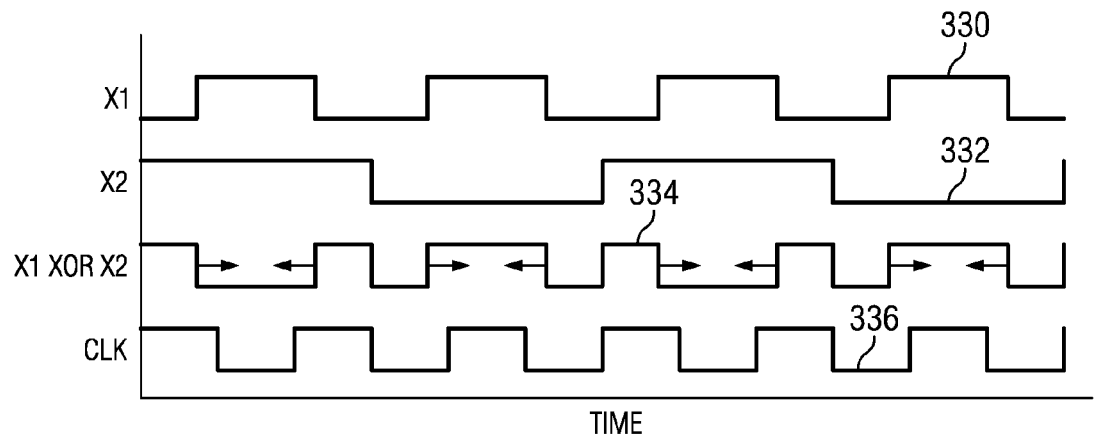
FIG. 12 is a timing diagram illustrating the various time domain traces for the second embodiment local oscillator generation mechanism of the present invention shown in FIG. 11.

A timing diagram illustrating the various time domain traces for the second embodiment local oscillator generation mechanism of the present invention of FIG. 11 is shown in FIG. 12. Trace 330 represents the X1 signal 324 while trace 332 represents the X2 signal 326. The result of the XORing of the X1 and X2 signals is represented by trace 334. The arrows in this trace indicate the direction of the delay required on the XOR signal 316 in order to create a perfect square wave clock (shown as trace 336). Arrows heading to the right indicate a positive delay while arrows leading to the left indicate a negative delay, wherein negative delays are implemented by manipulating the relative delay difference as described supra.

Note that the relationship between 334 and 336 exhibits momentary "negative delays", but it is well understood to one skilled in the art that if trace 334 was moved forward by 2*T/12=T/6, then the relative delays would be either 0 or T/12, thus establishing causality for the system. Please note that if the delays are perfectly T/12 then the generated signal has zero undesirable products.

Third Embodiment: Non-Harmonic DCO With XOR and Jitter Compensation #2

Figure 13:
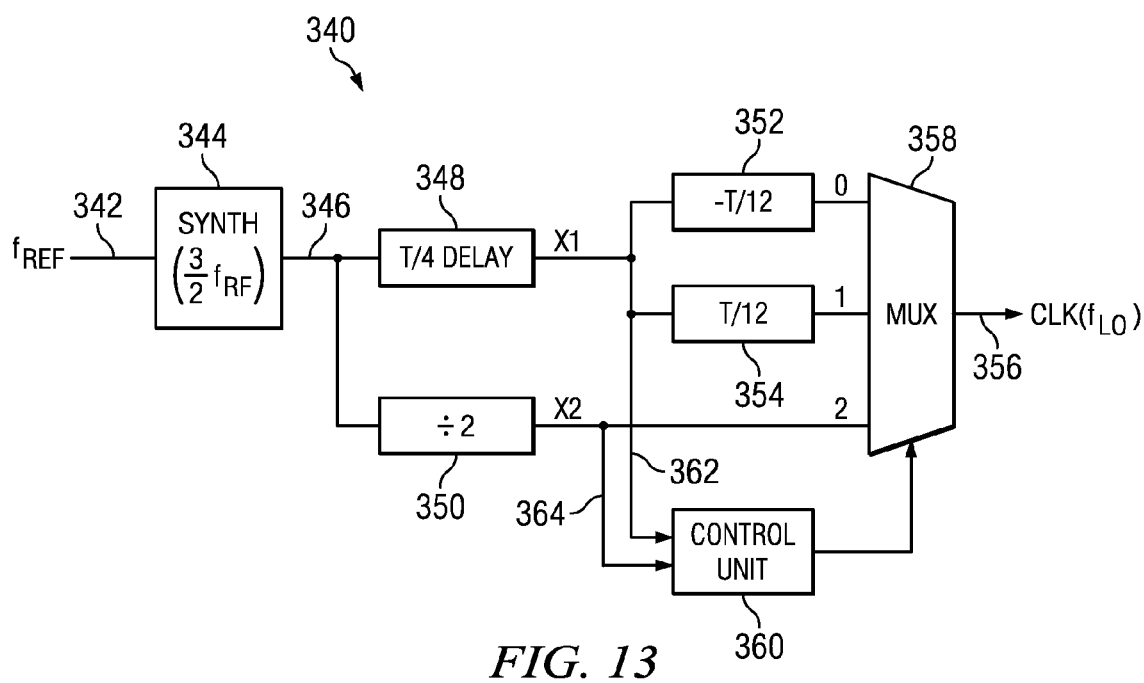
FIG. 13 is a block diagram illustrating a third embodiment of the local oscillator generation mechanism of the present invention.

A block diagram illustrating a third embodiment of the local oscillator generation mechanism of the present invention is shown in FIG. 13. The circuit, generally referenced 340, is a second implementation of the local oscillator generation scheme of FIG. 11. The circuit 340 comprises a synthesizer 344, T/4 delay 348, frequency divider 350, −T/12 delay circuit 353, T/12 delay circuit 354, multiplexer 358 and control unit (CU) 360.

In operation, a reference signal 342 is input to a synthesizer 344 tuned to exactly ⅔ $f_{RF}$. The digital signal 346 output of the synthesizer is input to both a T/4 delay circuit 348 as well as divide by two circuit 350, which are operative to generate signals X1 362 and X2 364, respectively. Note that here too, as described before, the T/4 delay circuit 348 is not needed if a quadrature generation of the 346 signal is available. Signal X1 undergoes delays of −T/12 via delay circuit 352 and +T/12 via delay circuit 354. The outputs of the delay circuits 353, 354 and signal X2 are input to a multiplexer 358 whose select control input is generated by the control unit 360, which may be implemented as a state machine or any other suitable processing or computing element. The inputs to the control unit comprise the signals X1 and X2. It is appreciated that one skilled in the electrical arts can program the control unit such that the multiplexer outputs a perfect clock signal in similar fashion to the circuit of FIG. 11.

Note that the implementations of both FIGS. 11 and 13 utilize asynchronous delays that can be implemented in deep-submicron processes using pre-calibrated inverter chains.

Note further that the pulling of edges of signal 334 in FIG. 12 in the time domain is equivalent to reducing the unwanted harmonics in the frequency domain. The non-perfect ±T/12 timing adjustments result in non-zero spurious energy of the harmonics. The amount of harmonic reduction is proportional to how close the timing delay is achieved. With a reasonable amount of inaccuracy, however, a substantial reduction could be achieved. This method could be combined with the use of band pass filtering, which in this embodiment would require less stringent filtering specifications.

Fourth Embodiment: LO Generation Circuit #1

Figure 14:
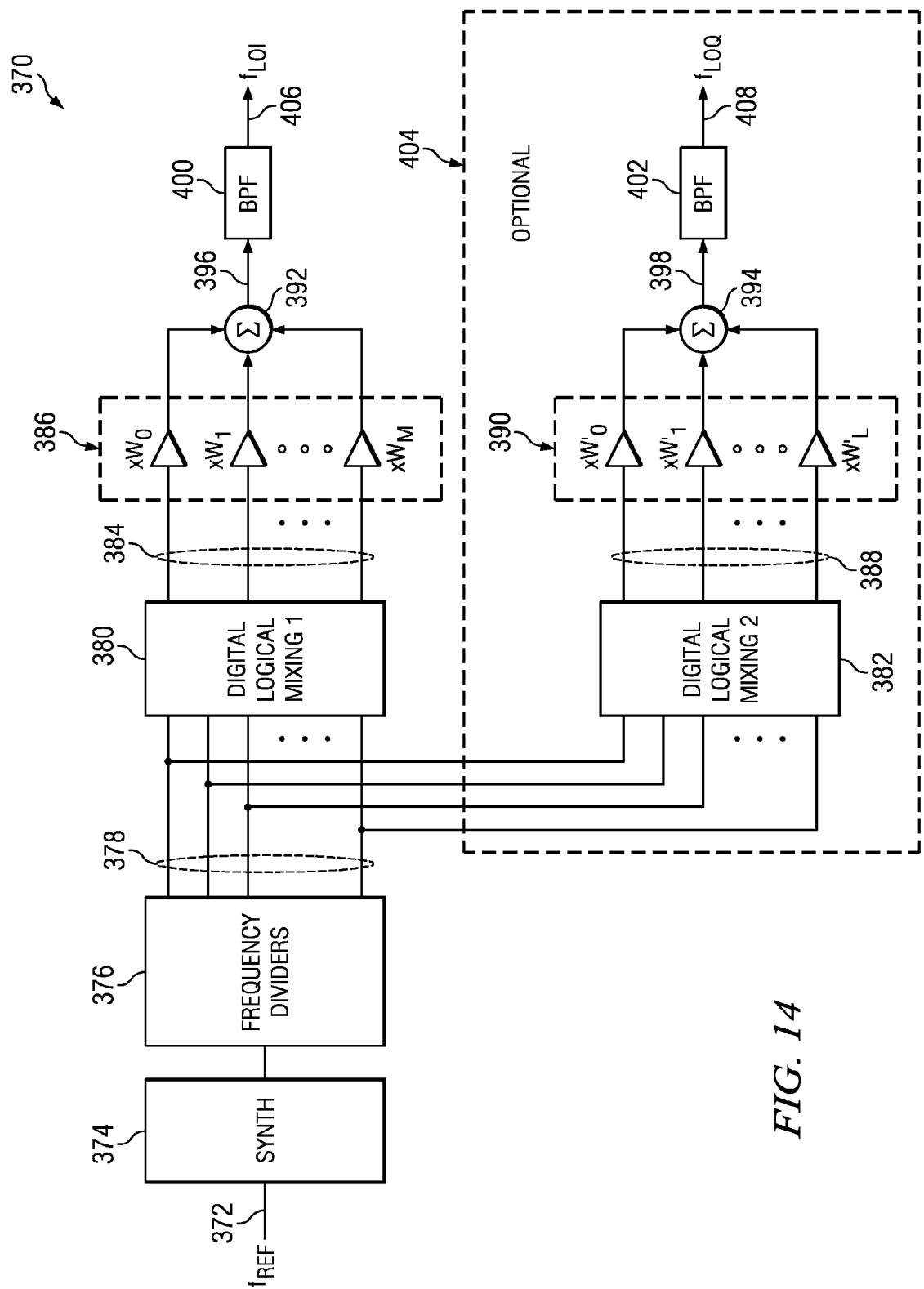
FIG. 14 is a block diagram illustrating a fourth embodiment of the local oscillator generation mechanism of the present invention.

A block diagram illustrating a fourth embodiment of the local oscillator generation mechanism of the present invention is shown in FIG. 14. The circuit, generally referenced 370, comprises a synthesizer 374, frequency dividers 376, digital logical mixing blocks 380, 382, weights 386, 390, summers 392, 394 and band pass filters 400, 402.

In operation, a frequency reference signal $f_{REF}$ 372 is input to the synthesizer 374 timed to a rational multiplier of the RF frequency $f_{RF}$. This signal is divided down via frequency dividers circuit 376. Please note that circuit 376 typically comprises several dividers and its outputs may be the result of multiple, sometime cascaded, division operations. The output of the frequency dividers is a plurality of phases 378 at various division ratios of the divided signal and stages within the division. For example, considering a division ratio of four, the divider can be implemented as a cascade of two divide by two circuits where the outputs are the in-phase and quadrature of the first divider, the in-phase and quadrature of a second divider operating on the in-phase of the first divider and the in-phase and quadrature signals of a second divider operating on the quadrature signal of the first divider.

The divided signals and phases 378 undergo processing by digital logical mixing block 1 380 which is operative to generate a plurality of combination signals 384 (M in total). Note that digital logical mixing block 1 may comprise either combinatory logic (represented by a truth-table), a finite state machine (FSM) or a combination thereof. The plurality of signals 384 output of digital logical mixing 1 undergo multiplication by a set of weights $w_0 \ldots w_M$ 386 followed by summation via adder 392 to yield in-phase signal 396.

Note that the circuit 370 comprises a semi-analog operation and can be implemented in numerous ways, as is appreciated by one skilled in the electrical arts. Examples of implementation of this circuit include (1) summation of current sources onto a load using binary or thermometry weighted CMOS transistors; and (2) using resistor or capacitor value ratios to sum voltages or currents.

A quadrature signal can be generated using optional block 404. Digital logical mixing block 2 382 outputs a different plurality of combination signals 388 (L in total) which is multiplied by a different set of weights $w'_0 \ldots w'_L$ 390 and summed via adder 394 to yield quadrature signal 398.

Finally, the summed values output of adders 392, 394 are filtered via BPF filters 400, 402 to yield the output $LO_I$ ($f_{LOI}$) 406, $LO_Q$ ($f_{LOQ}$) 408 signals, respectively. The summing operation effectively cancels out or significantly attenuates some of the undesired products to create a signal which is significantly easier to filter than that obtained using conventional mixing. A key benefit of this fourth embodiment of the present invention is that by operating the local oscillator at a rational multiplier of the RF frequency, the undesirable sidebands are kept low which eases or completely obviates any required filtering.

Fifth Embodiment: LO Generation Circuit #2

Figure 15:
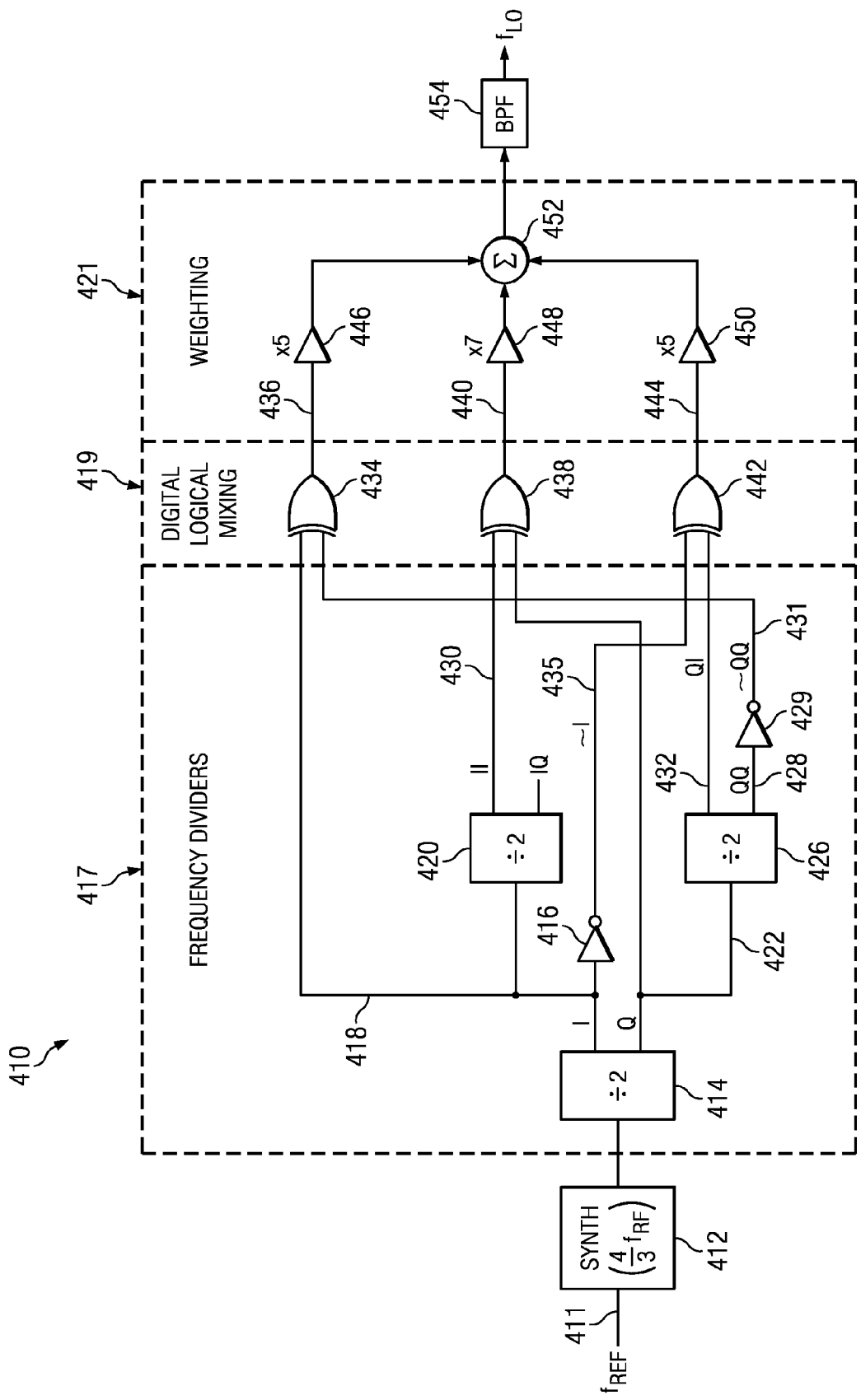
FIG. 15 is a block diagram illustrating a fifth embodiment of the local oscillator generation mechanism of the present invention.

A block diagram illustrating a fifth embodiment of the local oscillator generation mechanism of the present invention is shown in FIG. 15. This fifth embodiment is an example implementation of the LO generation circuit (fourth embodiment) of FIG. 14. The circuit, generally referenced 410, comprises frequency dividers 417, digital logical mixing 419 and weighting 421 blocks. The frequency dividers 417 block, coupled to synthesizer 412, comprises cascaded frequency dividers 414, 420, 426 and inverters 416, 429. The digital logical mixing block 419 comprises XOR gates 434, 438, 442. The weighting 421 block, coupled to band pass filter 454, comprises multipliers 446, 448, 450 and adder 452.

In operation, frequency reference signal $f_{REF}$ 411 is input to the frequency synthesizer 412 running at $4/3$ $R_{RF}$. The output of the synthesizer is divided by two via divider circuit 414 which outputs a quadrature pair I 418 and Q 422. The in-phase signal I 418 is divided again by divider circuit 420 into in-phase signal II 430 and a quadrature signal IQ. The quadrature signal Q 422 undergoes division by two via block 426 to yield a quadrature set QI 432 and QQ 428. Signal I 418 is also negated via inverter (i.e. not) circuit 416 to yield signal ~I 435. Similarly, signal QQ 428 is negated via inverter (i.e. not) circuit 429 to yield signal ~QQ 431.

XOR circuit 434 is operative to XOR signals I with signal ~QQ to yield signal 436. XOR circuit 438 is operative to XOR signals II and Q to yield signal 440. XOR circuit 442 is operative to XOR signals ~I and QI to yield signal 444. Signals 436, 440, 444 are multiplied by constant weights of 5, 7, 5, respectively. The weighted output signals are summed via adder 452. This summed signal undergoes filtering via BPF filter circuit 454. Note that the weights may be applied, for example, using analog multipliers, DPA circuits, op amps or any other suitable technique. Further, the filter alone is not sufficient to filter out the $\frac{1}{3}$ $f_{RF}$ signal, as greater than 90 dB attenuation is required for some applications (e.g., Bluetooth in a cellular phone), which is very difficult to achieve. The action of the weights and summer effectively cancel the $\frac{1}{3}$ $f_{RF}$ component and amplifies the $f_{RF}$ component.

Figure 16:
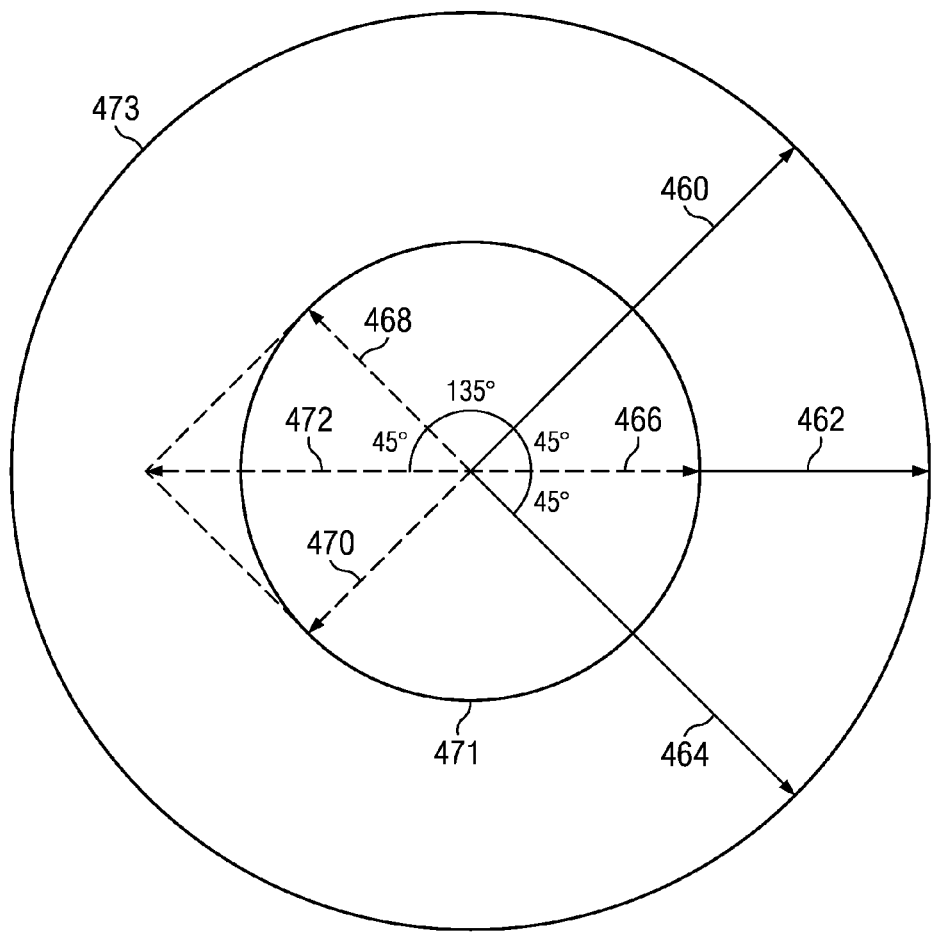
FIG. 16 is a phasor diagram illustrating the relationship between the products generated in the LO generation circuit of FIG. 15.

To aid in illustrating the principles of operation of this fifth embodiment, a phasor diagram illustrating the relationship between the products generated in the LO generation circuit of FIG. 15 is shown in FIG. 16. The phasor diagram shows the three generated signals. The vector arrows represent phasors of the generated signals in both the fundamental at $f_{RF}$ as well as the first undesired product (i.e. sub-harmonic) at $f_{RF}/3$. Phasor 468 represents signal 436 at $f_{RF}/3$ ($3/4\pi$ rotated product); phasor 470 represents signal 444 at $f_{RF}/3$; phasor 466 represents signal 440 at $f_{RF}/3$; phasor 460 represents the $9/4\pi$ rotated fundamental; phasor 462 represents the $f_{RF}$ component of signal 440; and phasor 472 represents the sum of phasors 468 and 470 (i.e. the sum of $3/4\pi$ and $-3/4\pi$ product rotations).

It is important to note that any phase difference $\Delta\Theta$ between two signals at $f_{RF}/3$ yields a phase difference of $3\Delta\Theta$ at $f_{RF}$. The radius of the inner circle 471 represents the magnitude of the $f_{RF}/3$ components while the radius of the outer circle 473 radius represents the magnitude of the $f_{RF}$ component. Without limiting generality, the phasors of signal 440 (i.e. X7 weight) are placed on the x axis. Hence phasor 466 is the $f_{RF}/3$ component of signal 440 (i.e. the main signal), while phasor 462 is the $f_{RF}$ component thereof.

The two auxiliary signals 436 and 444 have $f_{RF}/3$ components rotated by $3/4\pi$ and $-3/4\pi$ (i.e. 468 and 470, respectively) with respect to the main signal. Therefore, their $f_{RF}$ counterparts are rotated by $9/4\pi$ and $-9/4\pi$ (phasors 460 and 464), respectively, with respect to the main signal component at $f_{RF}$. Summing phasors 468 and 470, which have a π/2 phase difference between them, yields a vector with a magnitude of √2 larger than each one and the main signal component at $f_{RF}/3$ 466 with an angle of π with respect to it. Hence, the main signal should be multiplied by √2 (or each auxiliary signal by 1/√2) in order to achieve perfect cancellation at $f_{RF}/3$. Alternatively, the main signal is multiplied by 7 and each one of the auxiliary signals by 5. Since 7/5≅√2 to about 1% of accuracy a very reasonable cancellation is achieved.

The cancellation can be calculated as follows:

$$20 \log 10(|5 \cdot \sqrt{2} - 7|) \cong -23 \text{ dB} \tag{14}$$

Using this rational approximation makes the implementation simpler due to the ability to use thermometric weighted current sources or CMOS transistors. At the fundamental frequency $f_{RF}$ the auxiliary signal components add to the main signal component to create an even larger component. Since each one of the phasors 460 and 464 have a π/4 angle with phasor 462 and they are equal in magnitude, their sum is collinear with phasor 462 and has a magnitude of (7+5√2)=23 dB larger than the original size of phasor 462. The net cancellation (increase in fundamental at $f_{RF}$ combined with component attenuation at $f_{RF}/3$) is 23+23 =46 dB. Adding this to the original 5 dB difference between the fundamental and the component at $f_{RF}/3$, we obtain a 51 dB total difference. Depending on the implementation, this may require additional light attenuation or may be sufficient and the filter 454 (FIG. 15) can be replaced with a low pass filter, which is easier and less costly to implement.

Figure 17:
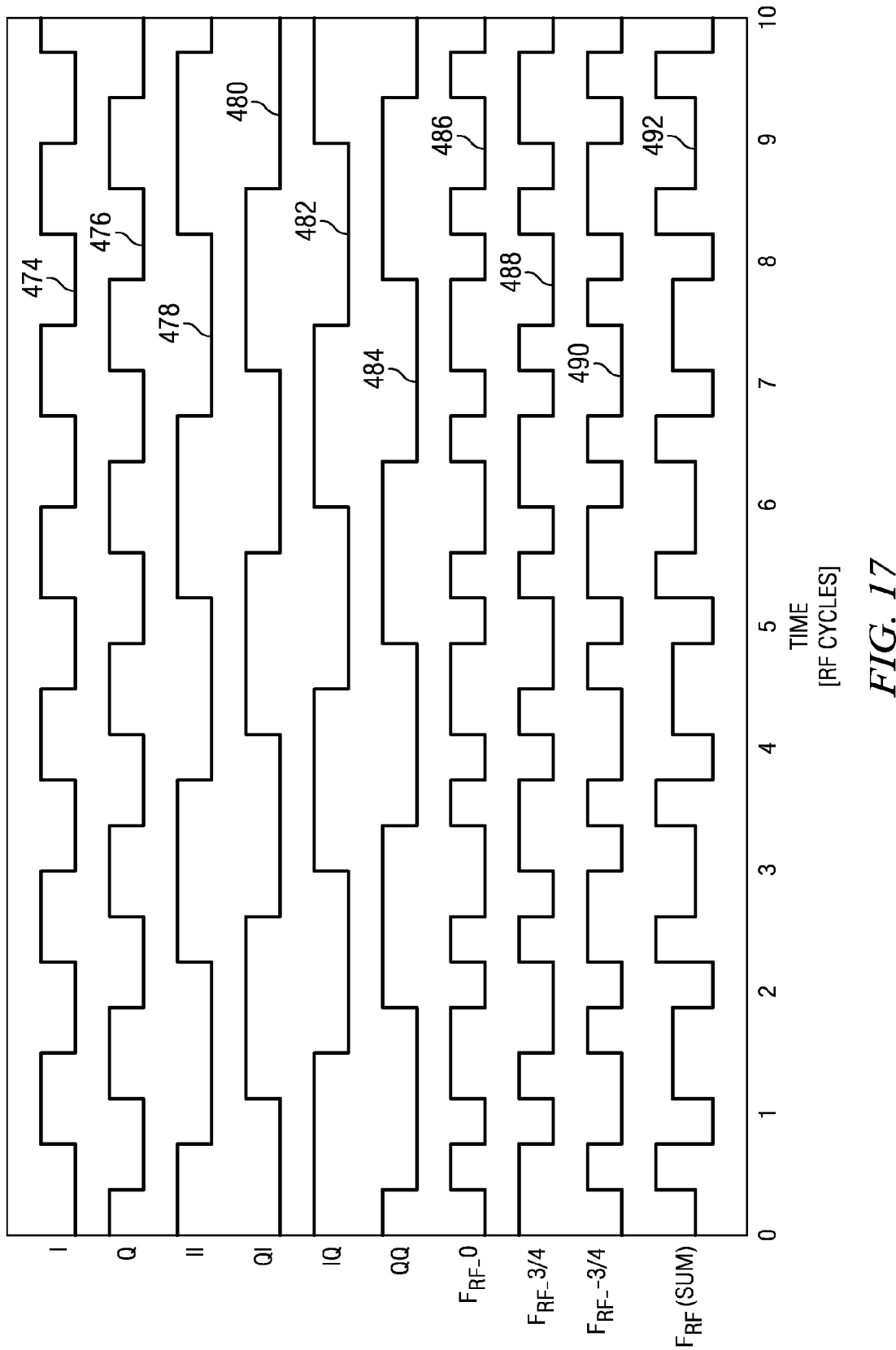
FIG. 17 is a timing diagram illustrating the various time domain traces for the fifth embodiment local oscillator generation mechanism of the present invention shown in FIG. 15.

A timing diagram illustrating the various time domain traces for the fifth embodiment local oscillator generation mechanism of the present invention shown in FIG. 15 is shown in FIG. 17. The timing diagram shows the time domain traces for the various signals in the circuit 410 of FIG. 15. Traces 474, 476, 478, 480, 482, 484 represent signals I, Q, II, QI, IQ, QQ, respectively. Trace 486 shows the main signal at weight 448, trace 488 shows the auxiliary signal at weight 446 and trace 490 shows the auxiliary signal at weight 450. Finally, trace 492 shows the sum of all weighted contributions (i.e. output of adder 452), which after filtering is the desired $f_{LO}$ output clock.

Figure 18:
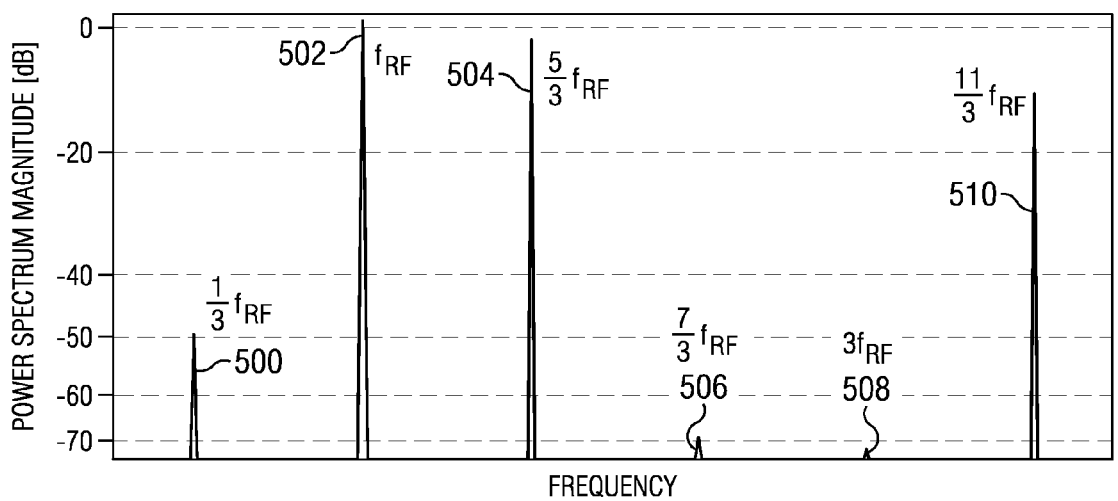
FIG. 18 is a graph illustrating the spectrum magnitude plot of the output of the circuit of FIG. 15.

A graph illustrating the spectrum magnitude plot of the output of the circuit of FIG. 15 is shown in FIG. 18. In particular, the spectrum magnitude plot shows the power spectral magnitude of trace 492. Component 500 at $f_{RF}/3$ has roughly a 50 dB attenuation with respect to the fundamental (i.e. desired) component 502 at $f_{RF}$. The next undesired component is at 5/3 $f_{RF}$ and is relatively easy to filter since it is almost an entire octave away from the fundamental component. There are additional undesirable components 506, 508, 510 at 7/3 $f_{RF}$, 3 $f_{RF}$ 11/3 $f_{RF}$, respectively. Thus, since the first undesired component 500 has an approximate 50 dB attenuation, the relatively expense band pass filter 454 (FIG. 15) can be replaced with a lower cost low pass filter.

Sixth Embodiment: LO Generation Circuit with Pulse Generation #1

Figure 19:
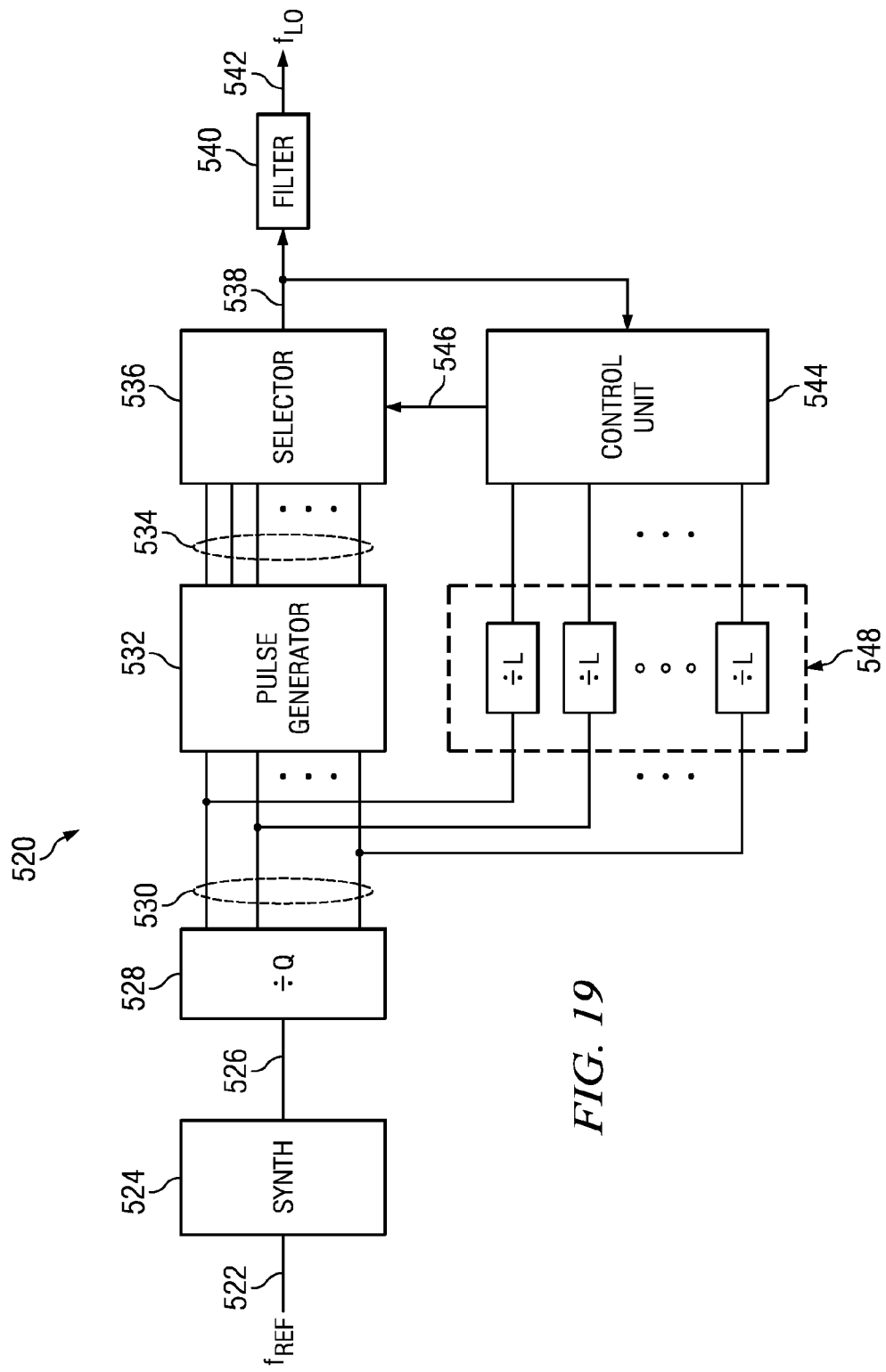
FIG. 19 is a block diagram illustrating a sixth embodiment of the local oscillator generation mechanism of the present invention.

A block diagram illustrating a sixth embodiment of the local oscillator generation mechanism of the present invention is shown in FIG. 19. The circuit, generally referenced 520, comprises a frequency synthesizer 524, frequency dividers 528, 548, pulse generator 532, selector block 536, control unit 544 and optional filter 540.

In operation, a frequency reference signal $f_{REF}$ 522 is input to the frequency synthesizer 524 operating at a rational multiplier of the RF frequency $f_{RF}$. The synthesizer generates a clock signal 526 at L/N $f_{RF}$, where L and N are integer numbers. The clock signal 526 is then divided by a factor of Q via divider circuit 528 to form exactly 2Q phases 530 of the clock at a frequency of L/(N*Q) $f_{RF}$. Each phase then undergoes division by L using divider circuits 548. The 2Q phase signals 530 are also input to pulse generator circuit(s) 532 which may comprise digital combinatory logic circuitry or asynchronous circuitry such as a mono-stable. The output of the pulse generator comprises a plurality of pulse signals 534 which are input to a selector block 536. The selector block functions to select which signal out of the plurality of pulse signals 534 to output as signal 538 at any point in time. The selector circuit may be implemented in any suitable manner such as a multiplexer, combinatory logic or a finite state machine (FSM).

A control unit (CU) 544 functions to receive both the output of the selector 538 as well as the output of dividers 548. Based on the inputs, the control unit outputs a select signal 546 which indicates to the selector 536 which of the pulses 534 to output at any given moment. The resultant signal 538 is the local oscillator clock signal which is generated in TDM fashion from the plurality of pulses 534. An optional filter 540 eliminates any undesired frequency spurs. Note that in the case of N=2, there are sufficient grid points to generate a fully periodic signal without any frequency spurs. Implementation imperfections, however, may generate spurious tones which may require filtering to limit the spurious spectrum of the output signal $f_{LO}$.

Seventh Embodiment: LO Generation Circuit with Pulse Generation #2

Figure 20:
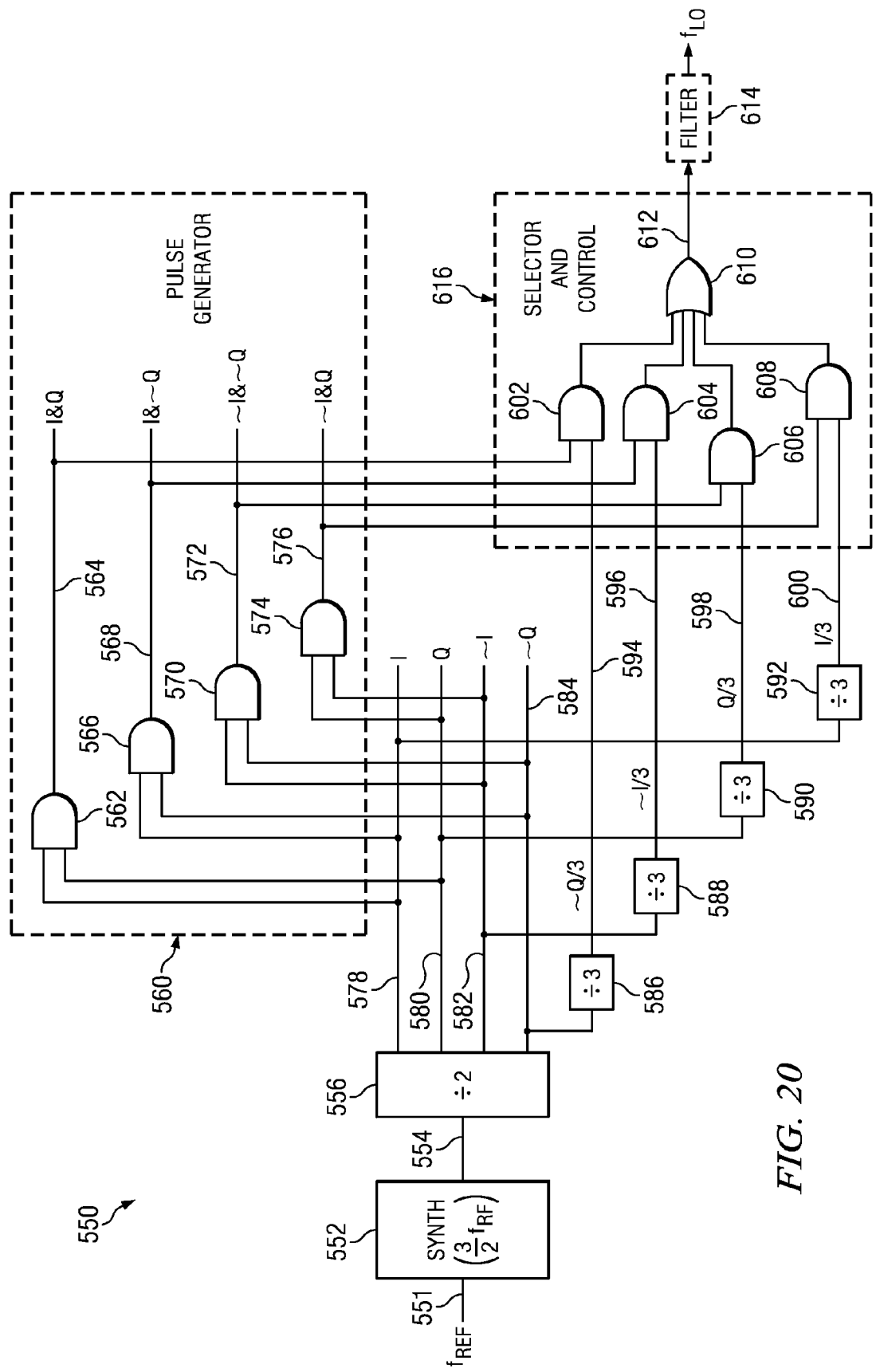
FIG. 20 is a block diagram illustrating a seventh embodiment of the local oscillator generation mechanism of the present invention.

A block diagram illustrating a seventh embodiment of the local oscillator generation mechanism of the present invention is shown in FIG. 20. The circuit, generally referenced 550, comprises frequency synthesizer 552, frequency dividers 556, 586, 588, 590, 592, gates 562, 566, 570, 574, 602, 604, 606, 608, 610 and optional filter 614.

In operation, a frequency reference signal $f_{REF}$ 551 is input to the frequency synthesizer 552 tuned to exactly 3/2 $f_{RF}$. The output 554 of the synthesizer is input to a divide by two circuit 556 which produces four phases of the input signal at an exact frequency of 3/4 $f_{RF}$. The four phases are denoted by their quadrature names and inverses, namely signal I 578, signal Q 580, signal ~I (i.e. not I) 582 and signal ~Q (i.e. not Q) 584. These four signals are input to the pulse generator circuit 560 which comprises four AND gates 562, 566, 570, 574. The four AND gates perform a logical AND operation between each possible pair of contiguous phases. In particular, AND gate 562 performs its operation between the I and Q signals to generate I&Q (i.e. I and Q) signal 564. AND gate 566 performs its operation between the I and ~Q signals to generate I&~Q (I AND NOT(Q)) signal 568. AND gate 570 performs its operation between the ~I and ~Q signals to generate ~I&~Q (NOT(I) AND NOT(Q)) signal 572. AND gate 574 performs its operation between ~I and Q signals to generate ~I&Q (NOT(I) and Q) signal 576. The four pulse output signals 564, 568, 572, 576 are input to the combined selector/control unit block 616.

The four phase signals output of the divide by two circuit 556 also undergo division by three. Divide by three circuit 586 divides the ~Q signal 584 to generate ~Q/3 signal 594 (NOT(Q) divided by three). Divide by three circuit 588 divides the ~I signal 582 to generate ~I/3 signal 596 (NOT(I) divided by three). Divide by three circuit 590 divides the Q signal 580 to produce Q/3 signal 598 (Q divided by three).

Divide by three circuit 592 divides the I signal 578 to generate I/3 signal 600 (I divided by three).

Combined selector and control unit 616 comprises four AND gates 602, 604, 606, 608, which AND the four divide by three output signals with their respective pulse signals. The respective results are wire-ORed together by OR circuit 610. The effective operation of the selector/control unit is to use the divide by three outputs 594, 596, 598, 600 as "one-hot" controls to select which pulse out of the four pulses (564, 568, 572, 576) will be output by the block. Note that in digital circuits, the term one-hot refers to a group of bits among which the legal combinations of values are only those with a single high ("1") bit and all the others low ("0"). Note also that this circuit preferably has an output with no sub-harmonics (lowest spectral tone being at $f_{RF}$), which permits much simpler filtering. An optional filter 614 can be used to attenuate any unwanted frequency spurs.

Figure 21:
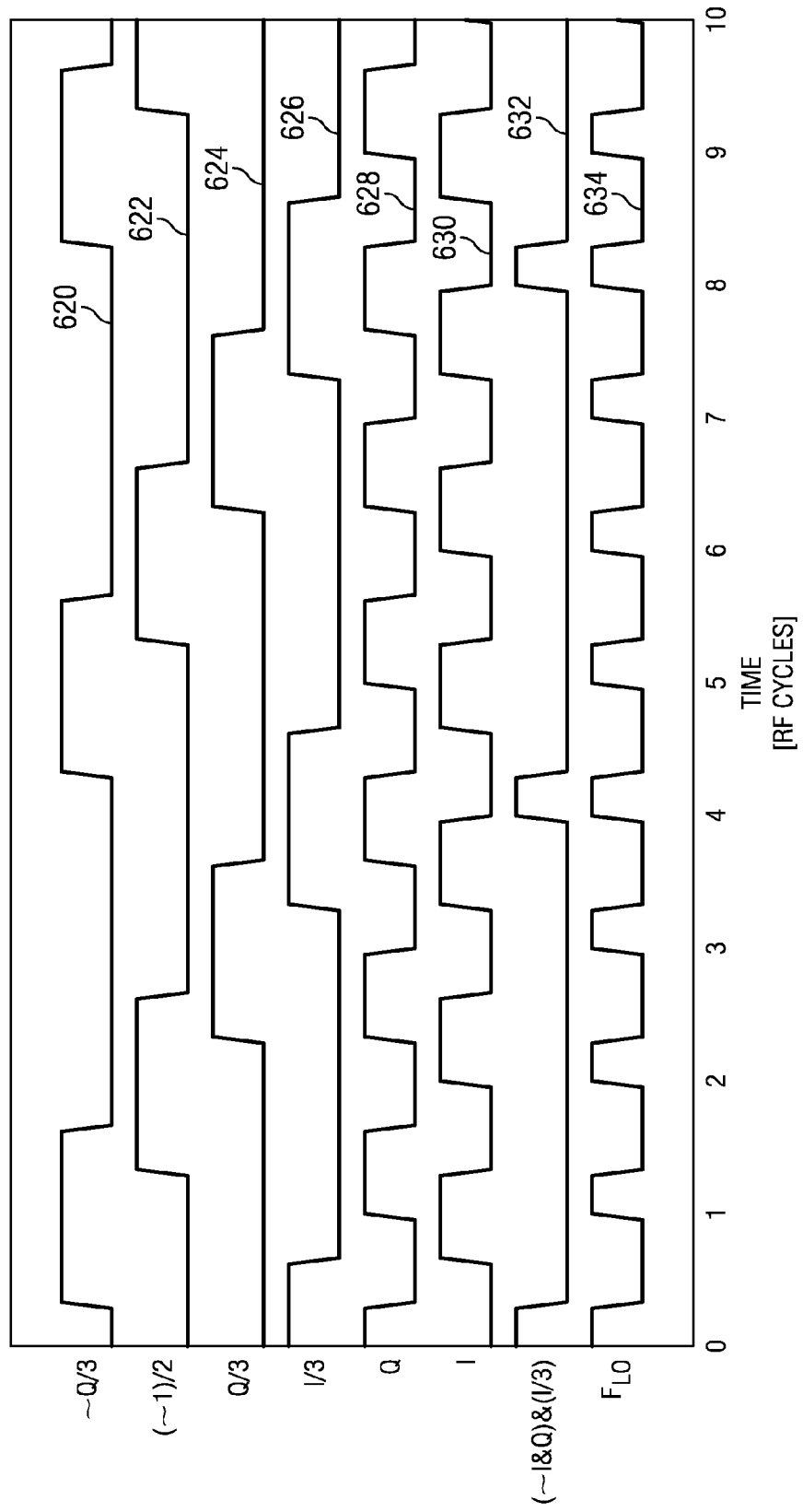
FIG. 21 is a timing diagram illustrating the various time domain traces for the seventh embodiment local oscillator generation mechanism of the present invention shown in FIG. 20.

A timing diagram illustrating the various time domain traces for the sixth embodiment local oscillator generation mechanism of the present invention of FIG. 20 is shown in FIG. 21. Trace 620 represents the output ~Q/3 594, trace 622 represents the output ~I/3 596, trace 624 represents the output Q/3 598 and trace 626 represents the output I/3 600. As can be seen from the timing diagram, the outputs of the dividers provide wide signals which can be used to gate the pulses in order to produce a perfect pulse train. Although this is not a perfect "one-hot" scheme where only one of these wide pulses can be active at any time, the situation where this might impede with the normal circuit operation is limited to the case of a pulse occurring in the overlap of two of the divider signals which is prevented by this circuit. Traces 628 and 630 represent the Q and I outputs, respectively. Trace 632 shows the output of AND gate 608. As can be seen, the narrow pulses generated by the pulse generation circuit are gated by the wide gate signals (signal 626 I/3 in this case) to produce one of the pulse phases ORed together to produce the $f_{LO}$ output clock signal 612 (FIG. 20) represented by trace 634.

Figure 22:
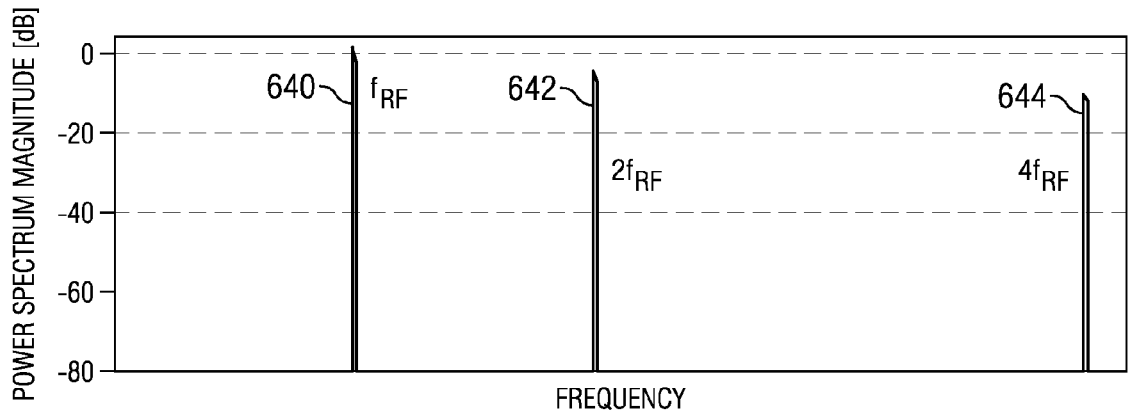
FIG. 22 is a graph illustrating the spectrum magnitude plot of the output of the circuit of FIG. 20.

A graph illustrating the spectrum magnitude plot of the output of the circuit of FIG. 20 is shown in FIG. 22. The spectrum magnitude plot is of the FIG. 12b shows a spectral plot of the $f_{LO}$ output clock signal 612 (trace 634). As can be seen, the lowest frequency tone 640 is produced at $f_{RF}$. Undesired tones 642 and 644 appear at the even harmonics 2 $f_{RF}$ and 4 $f_{RF}$, respectively.

Eighth Embodiment: LO Generation Circuit with Pulse Generation #3

Figure 23:
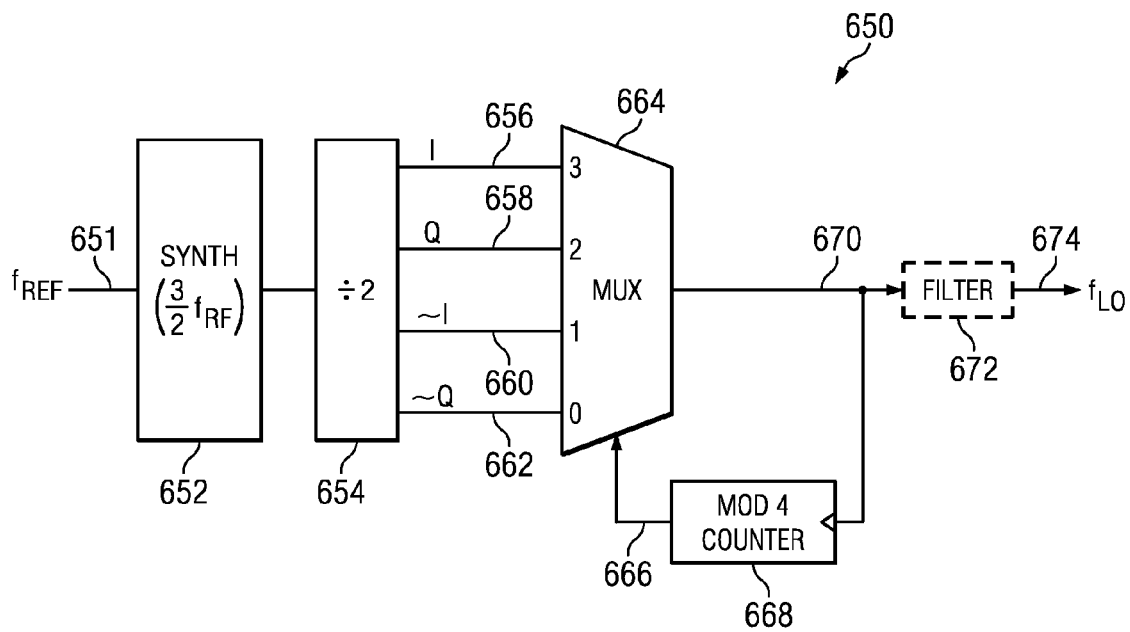
FIG. 23 is a block diagram illustrating an eighth embodiment of the local oscillator generation mechanism of the present invention.

A block diagram illustrating an eighth embodiment of the local oscillator generation mechanism of the present invention is shown in FIG. 23. The circuit, generally referenced 650, is a second example embodiment of the sixth embodiment of FIG. 19. The circuit 650 comprises frequency synthesizer 652, frequency divider 654, multiplexer 664, counter 668 and optional filter 672.

In operation, a frequency reference signal $f_{REF}$ 651 is input to the frequency synthesizer 652 running at ½ $f_{RF}$. The signal frequency output of the synthesizer is divided by two via divider circuit 654 which has four phase outputs, namely, the quadrature pair I and Q (656 and 658, respectively) and their inverses ~I and ~Q (660 and 662, respectively). The four phases are input to a multiplexer 664 which functions to output the desired local oscillator signal. The control unit in this embodiment which controls the multiplexer selection comprises a modulo-4 counter 668. The counter is clocked by the local oscillator output signal 670 and the output 666 is input to the selecting input of the multiplexer. In this embodiment, the selector circuit is implemented as the multiplexer 664 while the control unit is implemented as a modulo-4 counter 668. An optional filter 672 removes any unwanted frequency spurs.

It is noted that, in an alternative embodiment, the selecting input 666 is advantageously driven by one of the four phases of the output of divider 654. Driving a multiplexer selecting input by a signal that does not depend on the multiplexer output can be considered beneficial as is provides for more reliable operation.

Figure 24:
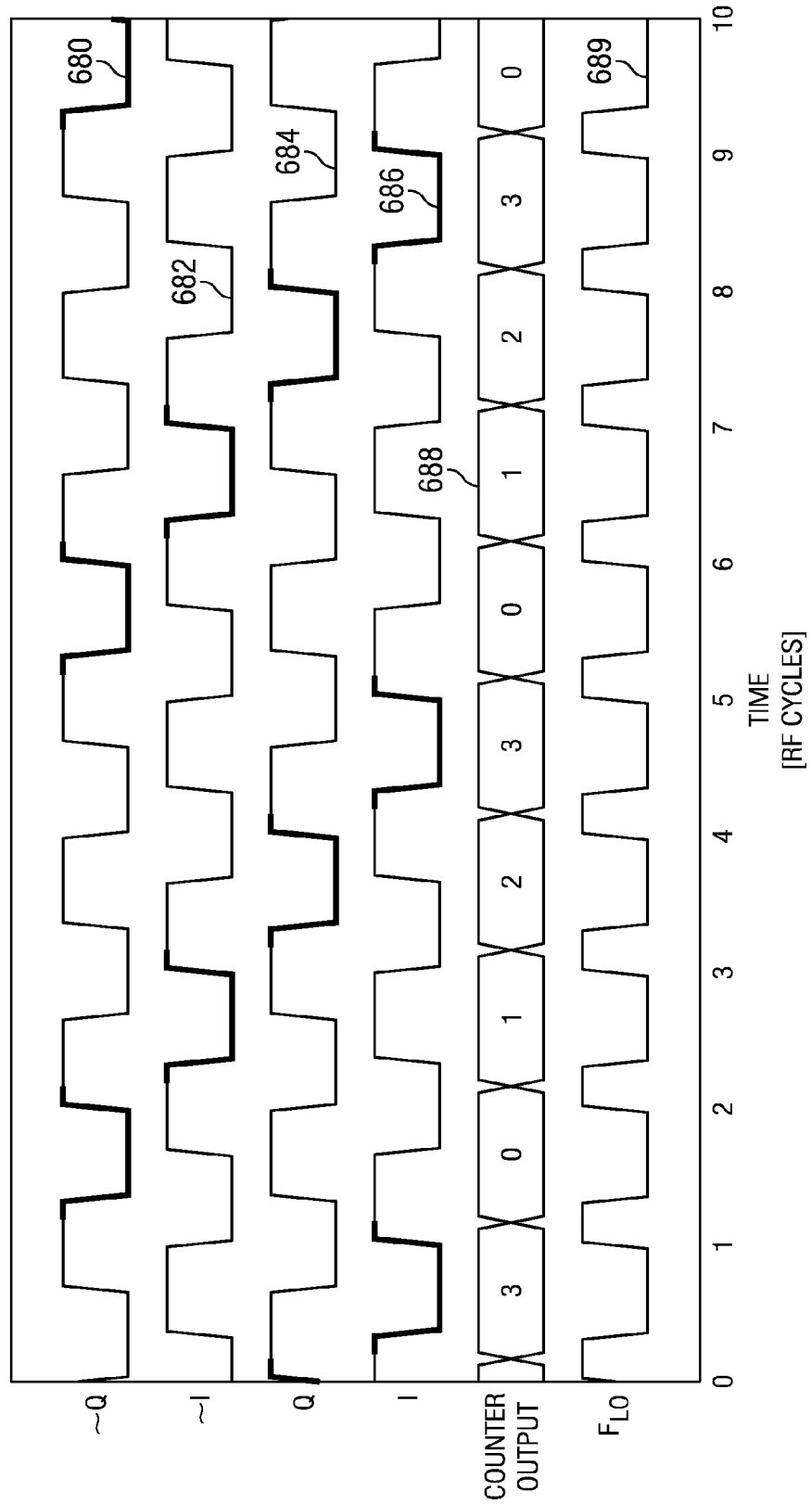
FIG. 24 is a timing diagram illustrating the various time domain traces for the eighth embodiment local oscillator generation mechanism of the present invention shown in FIG. 23.

A timing diagram illustrating the various time domain traces for the eighth embodiment local oscillator generation mechanism of the present invention of FIG. 23 is shown in FIG. 24. The timing diagram shows the various time domain traces for the signals of the circuit 650 of FIG. 23. Traces 680, 682, 684 and 686 represent the four phases (i.e. ~Q, ~I, Q and I), respectively. The thick lines in the traces represent the portions which are multiplexed to the output via multiplexer 664. Trace 688 represents the output of the counter 668. Trace 689 represents the output waveform $f_{LO}$ 674. As can be seen, notwithstanding a duty cycle aberration, the output waveform is a perfect signal at $f_{RF}$.

Figure 25:
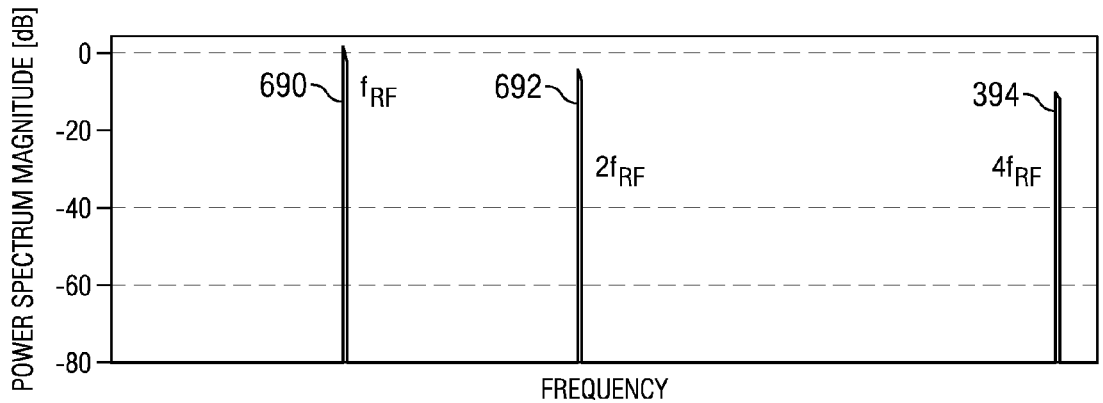
FIG. 25 is a graph illustrating the spectrum magnitude plot of the output of the circuit of FIG. 23.

A graph illustrating the spectrum magnitude plot of the output of the circuit of FIG. 23 is shown in FIG. 25. It is evident from the plot that the circuit does not generate a component at $f_{RF}/3$ and the largest frequency component 690 is at $f_{RF}$. In addition, even harmonics exist as undesired signals 692, 694 at 2 $f_{RF}$, 3 $f_{RF}$, etc. It is noted that the output local oscillator clock signal does not require filtering. Lower frequency components, however, may be created by timing mismatches at the multiplexer input. These unwanted frequency spurs can be minimized using careful analog design and layout techniques.

Ninth Embodiment: Non-Integer Local Oscillator Using Spectral Replicas

The ninth embodiment is described in the context of an example wireless link using non-integer LO incorporating a Cartesian DPA. A more detailed description of the operation of the DPA in the Cartesian transmitter can be found in U.S. Patent Publication No. 2006/0038710A1, cited supra.

The wireless link device may comprise any suitable device such as a multimedia player, mobile device, cellular phone, PDA, etc. For illustration purposes, the wireless link comprises a WLAN embedded in a mobile transmission and reception link. Note that this example is not intended to limit the scope of the invention as the Cartesian based replicas non-integer LO mechanism of the present invention can be implemented in a wide variety of communication devices.

The ninth embodiment utilizes spectral replicas generated when incorporating a zero order hold effect of the Digital Power Amplifier (DPA) during the modulation of a wideband signal. The sampling rate of the DPA is specifically configured such that one of the replicas falls directly in the desired in-band frequency. All other replicas are filtered using analog or digital filtering. The other replicas are set to fall into specific frequency bands that do not cause any interference to other radios. This allows the requirements of the analog filtering at the last stage to be significantly relaxed and thus simpler and less costly to implement.

Figure 26:
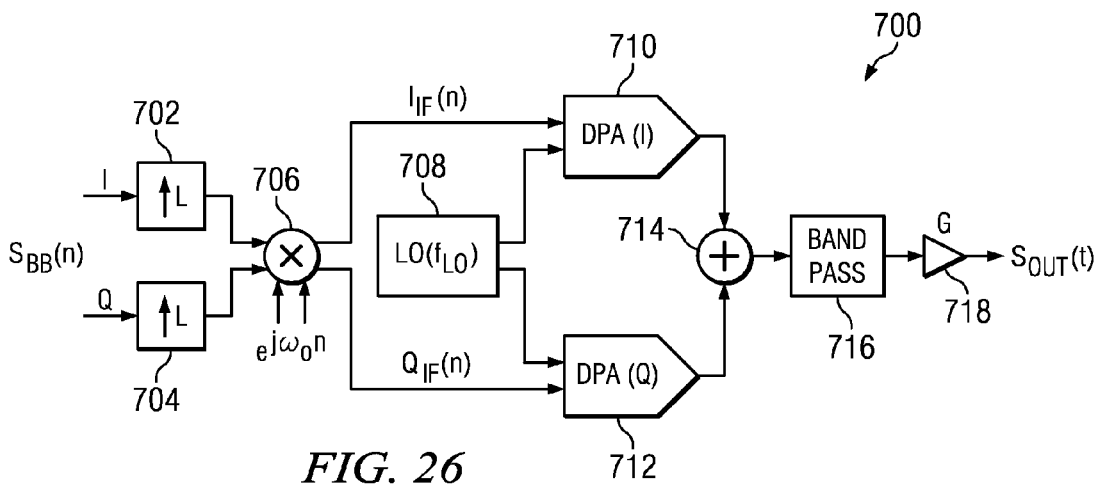
FIG. 26 is a block diagram illustrating a ninth embodiment of the local oscillator generation mechanism of the present invention incorporating the Cartesian based non-integer local oscillator.

A block diagram illustrating a ninth embodiment of the local oscillator generation mechanism of the present invention incorporating the Cartesian based non-integer local oscillator is shown in FIG. 26. The example transmitter circuit, generally referenced 700, comprises interpolators/upsamplers 702, 704, quadrature mixer 706, local oscillator 708, DPA circuits 710, 712, adder 714, band pass filter 716 and amplifier 718.

The transmitter 700 incorporates the Cartesian based dual DPA non-integer local oscillator of the present invention. In operation, the I and Q complex input baseband signal $S_{BB}(n)$ is upsampled and interpolated via blocks 702 and 704, respectively. The output of the interpolators are then upconverted in the digital domain using complex multiplier 706 resulting in a signal $I_{IF}(n)+jQ_{IF}(n)$ centered at IF. The IF frequency is adjusted to be half the LO's frequency so as to fit in the upconversion of the next stage.

The LO 708 is tuned to operate at a frequency which is a non integer ratio N/M of the LO to RF. Note that in the case of a Bluetooth or WLAN signal this ratio could be set to ⅔ division of the target RF frequency $f_{RF}$. The IF frequency is set to be half of the LO frequency so that the sampling rate of the last digital stage is equal to the LO frequency. The digital IF signal is then converted to the analog domain using two DPA circuits 710 and 712 for I and Q branches, respectively. The DPA circuits function to create two analog signals for the in-phase I and quadrature Q signals wherein the resulting signals include multiple replicas of the signals at $f_{IF}$, $f_{IF}+f_{LO}$, $f_{IF}+2\,f_{LO}$, etc., due to the ZOH nature of the DPA circuits.

The resultant I and Q analog signals are then combined via adder 714 (e.g., voltage or current combiner). The output of the adder is then filtered using BPF 716 to extract the desired replica. The frequency of the replica is selected so that it does not fall in any cellular band.

Attenuation is required only if the level of the replicas is above any requirement or standard (e.g., FCC, etc.). The filtered signal may be amplified by a power amplifier (PA) 718 that may be embedded on or off the radio integrated circuit chip.

Figure 27:
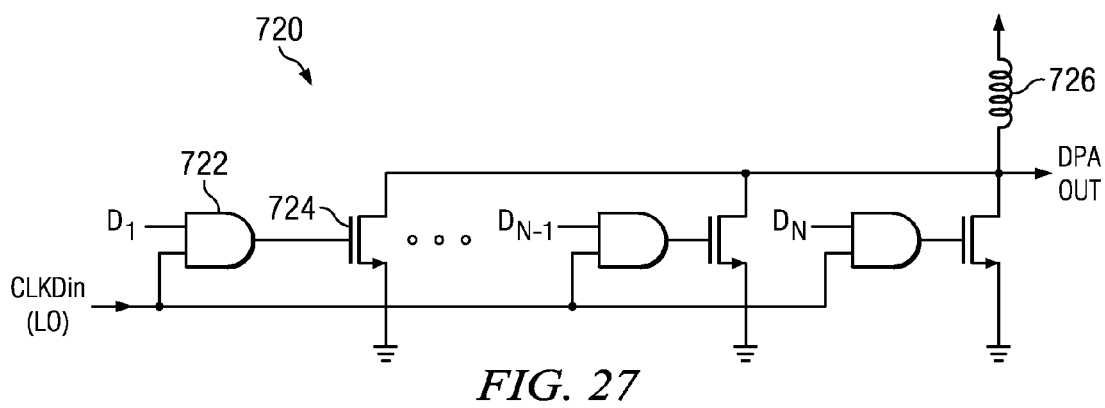
FIG. 27 is a simplified block diagram illustrating the DPA of the local oscillator generation circuit of FIG. 26 in more detail.

A simplified block diagram illustrating the DPA of the local oscillator generation circuit of FIG. 26 in more detail is shown in FIG. 27. The DPA circuit, generally referenced 720, comprises a plurality of gates 722 and transistors 724, and an RF inductor portion of the load 726. In operation, the clock signal is gated with a control word (inputs $D_I$ through $D_N$). The value of the control word at any instant in time determines the amplitude of the signal output of the DPA. The clock signal (i.e. LO output) input to the DPA also functions as its sampling frequency. Therefore, the spectrum at the output of the complex multiplier is repeated every sampling frequency $f_S$. Thus, an analog mixer is not required for further upconversion since the first replica of the DPA output can be used instead. The replicas generated by the ZOH effect of the DPA are repeated every sampling frequency (i.e. the LO frequency). Since the complex IF signal is located at the $f_{LO}/2$ than the first replica will be located at $f_{LO}+f_{LO}/2$.

As an example, consider a Bluetooth transmission. In this Bluetooth example, the RF frequency $f_{RF}$ is tuned to 2402 MHz (i.e. the first Bluetooth channel). The local oscillator frequency is therefore tuned to $f_{LO}=f_{RF}/3=1601.33$ MHz. In this case, the DPA also creates a very strong replica (only 13 dB less than the "main replica") positioned at $f_{RF}=f_{LO}+f_{IF}=f_{LO}+f_{LO}/2=(3/2)*f_{LO}=(3/2)*1601.33=2402$ MHz.

Figure 28:
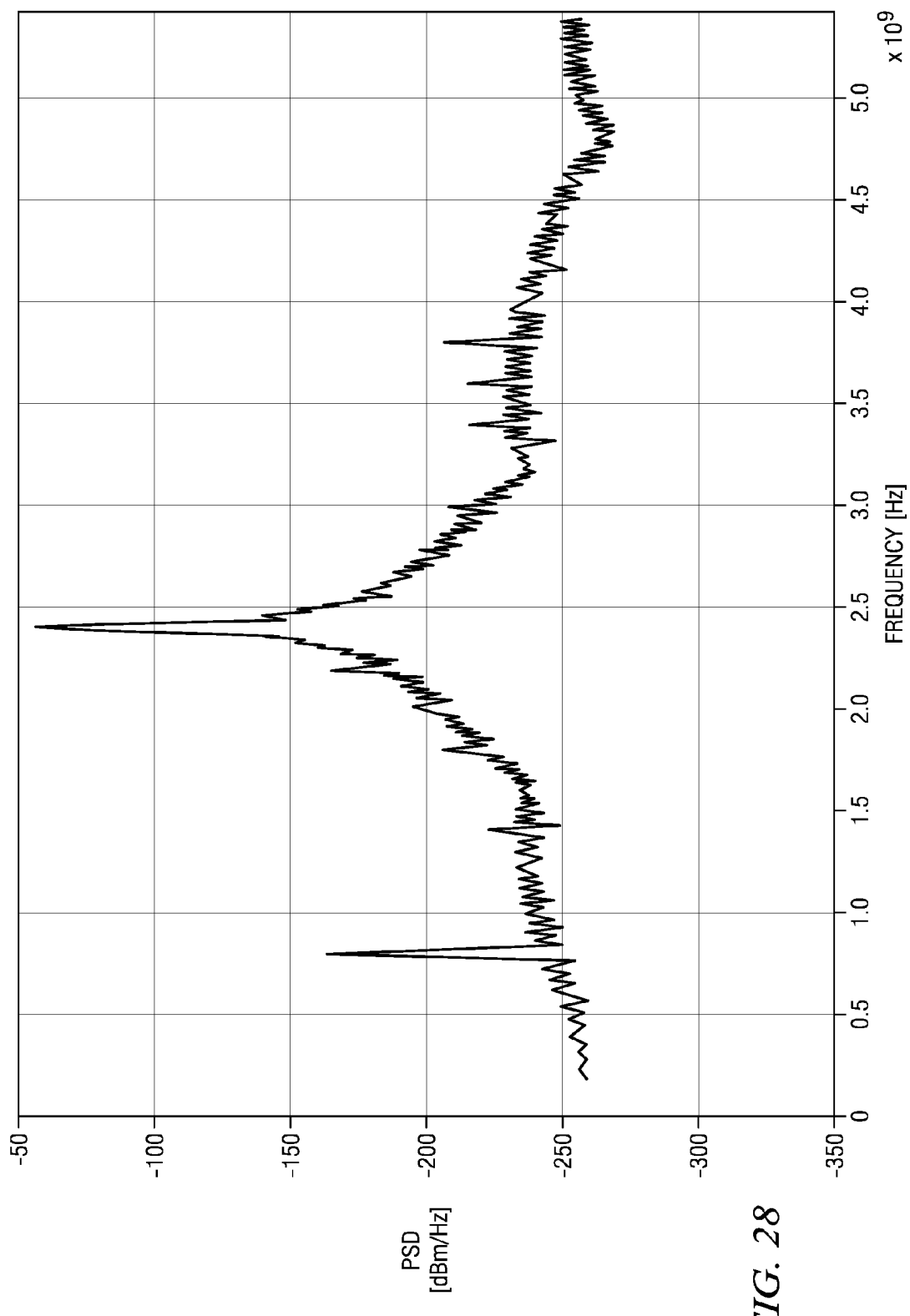
FIG. 28 is a graph illustrating simulation results of the spectrum at the output of the transmitter employing the Cartesian based non-integer local oscillator of FIG. 26.

A graph illustrating simulation results of the spectrum at the output of the transmitter employing the Cartesian based non-integer local oscillator of FIG. 26 is shown in FIG. 28. Note that the 2402 MHz peak shown is obtained as a result of filtering the first replica.

The ninth embodiment thus provides an efficient method to implement the local oscillator and to generate the required clock signal. The method uses a complex multiplier intended to shift the zero baseband signal such that it is centered on $f_{LO}/2$ (e.g., 1601.33/2=800.6 MHz). Subsequent processing by the two DPA circuits generates outputs which are easily combined using a voltage or current combiner. The two DPA circuits and combiner could further be simplified by connecting the drain junction of each of the DPAs to the same inductor used to pump the current during the transitions of the DPA thereby reducing the complexity of the combiner.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. An apparatus for generating a local oscillator signal having an output frequency, said method comprising the steps of:
   an oscillator circuit operative to generate a first signal, said first signal having a frequency substantially equal to a rational multiplier N/M of said output frequency;
   means for dividing said first signal to generate a plurality of second signal phases;
   a first logical mixing circuit operative to generate M third signals as combinations of said plurality of second signal phases;
   means for applying a first set of weights to said M third signals to yield M fourth signals; and
   a summer operative to combine said M fourth signals to generate an in-phase output signal having a frequency substantially equal to said output frequency.

2. The apparatus according to claim 1, wherein said rational multiplier equals four-thirds.

3. The apparatus according to claim 1, wherein said means for dividing comprises means for generating said plurality of second signal phases as a plurality of division ratios of the divided signal and stages within said division.

4. The apparatus according to claim 1, wherein said means for dividing comprises two cascaded divide by two blocks.

5. The apparatus according to claim 1, wherein means for applying said first set of weights comprises thermometer weighting employing identical elements.

6. The apparatus according to claim 1, further comprising a filter coupled to receive said in-phase output signal and operative to attenuate unwanted products to yield a filtered in-phase output signal therefrom.

7. The apparatus according to claim 1, wherein said first logical mixing circuit comprises one or more XOR gates.

8. The apparatus according to claim 1, further comprising:
   a second logical mixing circuit operative to generate L fifth signals as combinations of said plurality of second signal phases, wherein L is a positive integer;
   means for applying a second set of weights to said L fifth signals to yield L sixth signals; and
   a summer operative to combine said L sixth signals to generate a quadrature output signal having a frequency substantially equal to said output frequency.

9. The apparatus according to claim 8, further comprising a filter coupled to receive said quadrature output signal and operative to remove unwanted products therefrom to yield a filtered quadrature output signal therefrom.

10. The apparatus according to claim 8, wherein said second logical mixing circuit comprises one or more XOR gates.

11. A method of generating a local oscillator signal having an output frequency, said method comprising the steps of:

generating a first signal at a first frequency, said first signal having a frequency substantially equal to a rational multiplier of said output frequency;

dividing said first signal to generate a plurality of second signal phases;

generating M third signals as combinations of said plurality of second signal phases;

applying a first set of weights to said M third signals to yield M fourth signals; and summing said M fourth signals to generate an in-phase output signal having a frequency substantially equal to said output frequency.

12. The method according to claim 11, wherein said first frequency is four-thirds of said output frequency.

13. The method according to claim 11, further comprising the step of filtering said in-phase output signal to remove unwanted products to yield a filtered in-phase output signal therefrom.

14. The method according to claim 11, wherein said step of applying comprises utilizing thermometer weighting employing identical elements.

15. The method according to claim 11, further comprising the steps of:

generating L fifth signals as combinations of said plurality of second signal phases, wherein L is a positive integer;

applying a second set of weights to said L fifth signals to yield L sixth signals; and summing said L sixth signals to generate a quadrature output signal having a frequency substantially equal to said output frequency.

16. The method according to claim 15, further comprising the step of filtering said quadrature output signal to remove unwanted products to yield a filtered quadrature output signal therefrom.

17. A radio, comprising:

a transmitter coupled to an antenna, said transmitter comprising a local oscillator having an output frequency, said local oscillator comprising:

an oscillator circuit operative to generate a first signal at a first frequency, said first signal having a frequency substantially equal to a rational multiplier of said output frequency;

means for dividing said first signal to generate a plurality of second signal phases;

a first logical mixing circuit operative to generate M third signals as combinations of said plurality of second signal phases;

means for applying a first set of weights to said M third signals to yield M fourth signals;

a summer operative to combine said M fourth signals to generate an in-phase output signal having a frequency substantially equal to said output frequency;

a receiver coupled to said antenna; and a baseband processor coupled to said transmitter and said receiver.

18. The radio according to claim 17, wherein said first frequency is four-thirds of said output frequency.

19. The radio according to claim 17, further comprising a filter coupled to receive said in-phase output signal and operative to remove unwanted products therefrom to yield a filtered in-phase output signal therefrom.

20. The radio according to claim 17, wherein said first logical mixing circuit comprises one or more XOR gates.

21. The radio according to claim 17, wherein said first logical mixing circuit comprises one or more XOR gates.

22. The radio according to claim 17, wherein said means for dividing comprises two cascaded divide-by-two circuits.

23. The radio according to claim 17, wherein means for applying said first set of weights comprises thermometer weighting employing identical elements.

24. The radio according to claim 17, further comprising:

a second logic circuit operative to generate L fifth signals as combinations of said plurality of second signal phases, wherein L is a positive integer;

means for applying a second set of weights to said L fifth signals to yield L sixth signals; and a summer operative to combine said L sixth signals to generate a quadrature output signal having a frequency substantially equal to said output frequency.

25. The radio according to claim 22, further comprising a filter coupled to receive said quadrature output signal and operative to remove unwanted products therefrom to yield a filtered quadrature output signal therefrom.

26. The radio according to claim 22, wherein said second logic circuit comprises one or more XOR gates.

* * * * *